United States Patent
Liao et al.

(10) Patent No.: US 12,494,401 B2
(45) Date of Patent: Dec. 9, 2025

(54) SEMICONDUCTOR PACKAGE AND METHOD

(71) Applicant: Taiwan Semiconductor Manufacturing Co., Ltd., Hsinchu (TW)

(72) Inventors: Yi-Huan Liao, Hsinchu (TW); Ping-Yin Hsieh, Hsinchu (TW); Chih-Hao Chen, Taipei (TW); Pu Wang, Hsinchu (TW); Li-Hui Cheng, New Taipei (TW); Ying-Ching Shih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 510 days.

(21) Appl. No.: 17/822,470

(22) Filed: Aug. 26, 2022

(65) Prior Publication Data

US 2024/0071847 A1 Feb. 29, 2024

(51) Int. Cl.
*H01L 23/10* (2006.01)
*H01L 21/52* (2006.01)
(Continued)

(52) U.S. Cl.
CPC .............. *H01L 23/10* (2013.01); *H01L 21/52* (2013.01); *H01L 21/56* (2013.01); *H01L 23/16* (2013.01);
(Continued)

(58) Field of Classification Search
CPC ......... H01L 23/10; H01L 21/52; H01L 21/56; H01L 23/16; H01L 23/3121; H01L 23/367; H01L 23/5383; H01L 23/5385; H01L 23/562; H01L 24/32; H01L 24/13; H01L 24/16; H01L 24/29; H01L 24/73; H01L 24/81; H01L 24/83; H01L 2224/16227; H01L 21/563; H01L 23/053; H01L 23/49816
See application file for complete search history.

(56) References Cited

U.S. PATENT DOCUMENTS 8,993,380 B2   3/2015   Hou et al.
9,281,254 B2   3/2016   Yu et al.
(Continued)

FOREIGN PATENT DOCUMENTS

TW   201903996 A   1/2019
TW   201913920 A   4/2019
(Continued)

*Primary Examiner* — Douglas W Owens
(74) *Attorney, Agent, or Firm* — Slater Matsil, LLP

(57) ABSTRACT

A semiconductor package including two different adhesives and a method of forming are provided. The semiconductor package may include a package component having a semiconductor die bonded to a substrate, a first adhesive over the substrate, a heat transfer layer on the package component, and a lid attached to the substrate by a second adhesive. The first adhesive may encircle the package component and the heat transfer layer. The lid may include a top portion on the heat transfer layer and the first adhesive, and a bottom portion attached to the substrate and encircling the first adhesive. A material of the second adhesive may be different from a material of the first adhesive.

20 Claims, 29 Drawing Sheets

(51) Int. Cl.
*H01L 21/56* (2006.01)
*H01L 23/00* (2006.01)
*H01L 23/16* (2006.01)
*H01L 23/31* (2006.01)
*H01L 23/367* (2006.01)
*H01L 23/538* (2006.01)

(52) U.S. Cl.
CPC ........ *H01L 23/3121* (2013.01); *H01L 23/367* (2013.01); *H01L 23/5383* (2013.01); *H01L 23/5385* (2013.01); *H01L 23/562* (2013.01); *H01L 24/32* (2013.01); *H01L 24/13* (2013.01); *H01L 24/16* (2013.01); *H01L 24/29* (2013.01); *H01L 24/73* (2013.01); *H01L 24/81* (2013.01); *H01L 24/83* (2013.01); *H01L 2224/131* (2013.01); *H01L 2224/16227* (2013.01); *H01L 2224/29124* (2013.01); *H01L 2224/29144* (2013.01); *H01L 2224/29155* (2013.01); *H01L 2224/29166* (2013.01); *H01L 2224/29172* (2013.01); *H01L 2224/2929* (2013.01); *H01L 2224/29298* (2013.01); *H01L 2224/32225* (2013.01); *H01L 2224/32245* (2013.01); *H01L 2224/73204* (2013.01); *H01L 2224/73253* (2013.01); *H01L 2224/81424* (2013.01); *H01L 2224/81447* (2013.01); *H01L 2224/81455* (2013.01); *H01L 2224/81466* (2013.01); *H01L 2224/81484* (2013.01); *H01L 2224/83447* (2013.01); *H01L 2224/83455* (2013.01)

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 11,621,205 | B2 * | 4/2023 | Chen ............... H01L 24/94 257/668 |
| 12,278,155 | B2 * | 4/2025 | Boutaleb ............ H01L 23/36 |
| 2018/0166351 | A1 * | 6/2018 | Han ................... H01L 23/053 |
| 2018/0350754 | A1 * | 12/2018 | Huang .............. H01L 25/0655 |
| 2019/0067157 | A1 | 2/2019 | Lin et al. |
| 2019/0214367 | A1 | 7/2019 | Chen et al. |
| 2020/0083143 | A1 | 3/2020 | Tsai et al. |
| 2021/0050332 | A1 * | 2/2021 | Lee ................. H01L 23/3675 |
| 2021/0193538 | A1 | 6/2021 | Huang et al. |
| 2021/0202358 | A1 * | 7/2021 | Tsao ............... H01L 23/49833 |
| 2021/0202455 | A1 * | 7/2021 | Tsai ................ H01L 25/0655 |
| 2021/0233833 | A1 * | 7/2021 | Ku ..................... H01L 24/20 |
| 2022/0051970 | A1 | 2/2022 | Park et al. |
| 2022/0102313 | A1 | 3/2022 | Jeng et al. |
| 2022/0230985 | A1 | 7/2022 | Chen et al. |
| 2023/0378017 | A1 * | 11/2023 | Hsieh ............... H01L 23/3157 |
| 2024/0038617 | A1 * | 2/2024 | Hung ............... H01L 23/3737 |

FOREIGN PATENT DOCUMENTS

| | | |
|---|---|---|
| TW | 201931545 A | 8/2019 |
| TW | 202230708 A | 8/2022 |

* cited by examiner

SEMICONDUCTOR PACKAGE AND METHOD

BACKGROUND

The formation of integrated circuits includes forming integrated circuit devices on semiconductor wafers, and then sawing the semiconductor wafers into device dies. The device dies may be bonded to package components such as interposers, package substrates, printed circuit boards, or the like. To protect the device dies and the bonding structures that bond a device die to a package component, an encapsulant such as a molding compound, an underfill, or the like, may be used to encapsulate the device dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
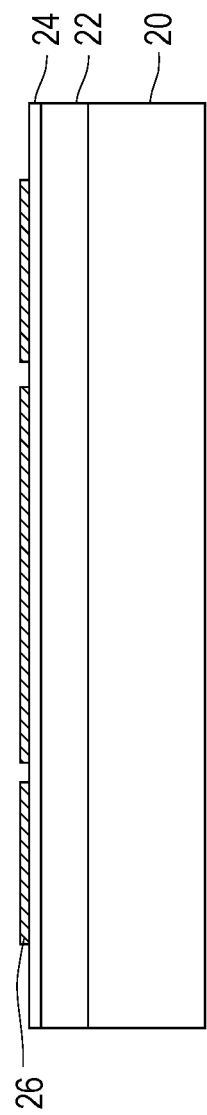
FIGS. 1-9, 10A, 10B, 11-17, 18A, 18B, 18C, 18D, 19A, 19B, 20A, and 20B illustrate the cross-sectional views and top views of intermediate stages in the formation of a semiconductor package including two different adhesives in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package with two different adhesives and the methods of forming the same are provided. In accordance with some embodiments, a package structure comprising semiconductor dies, an interposer, and an encapsulant, is bonded to a substrate. A metal layer is disposed on the package structure and in contact with the semiconductor dies. A lid is attached to the substrate and disposed over the metal layer. A heat transfer layer is disposed between and bonded to the metal layer and the lid. A first adhesive of a high stiffness, which encircles the package structure, is disposed between the lid and the substrate. The first adhesive may provide support to the lid, which may mitigate the warping of the lid and improve the bonding between the heat transfer layer and the lid as well as the bonding between the heat transfer layer and the metal layer. The first adhesive also forms a seal with the lid that confines the heat transfer layer. During the reflowing of the heat transfer layer, high pressure is created in the seal, which may reduce the quantity and sizes of voids in the heat transfer layer. As a result, heat transfer from the semiconductor dies, through the metal layer and the heat transfer layer, to the lid is improved. A second adhesive of a low stiffness is used to attach the lid to the substrate. The second adhesive may mitigate the mismatch between the coefficient of thermal expansion of the lid and the coefficient of thermal expansion of the substrate, which may prevent or reduce the cracking of the package structure, thereby improving the long-term reliability of the semiconductor package.

Figure 4:
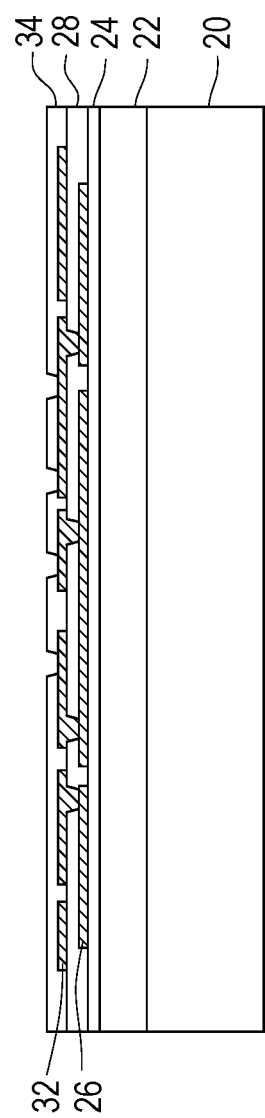
Figure 5:
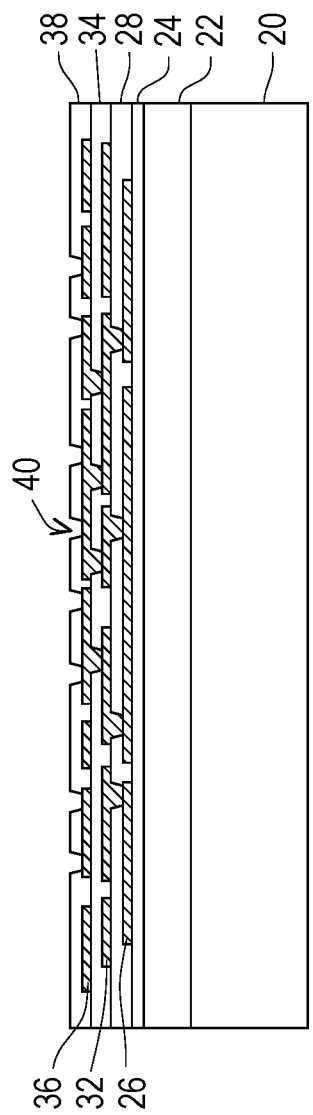
Figure 6:
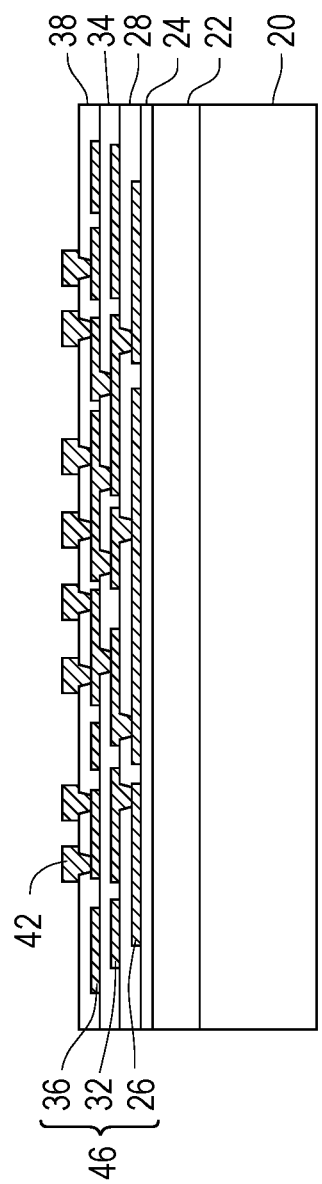
Figure 21:
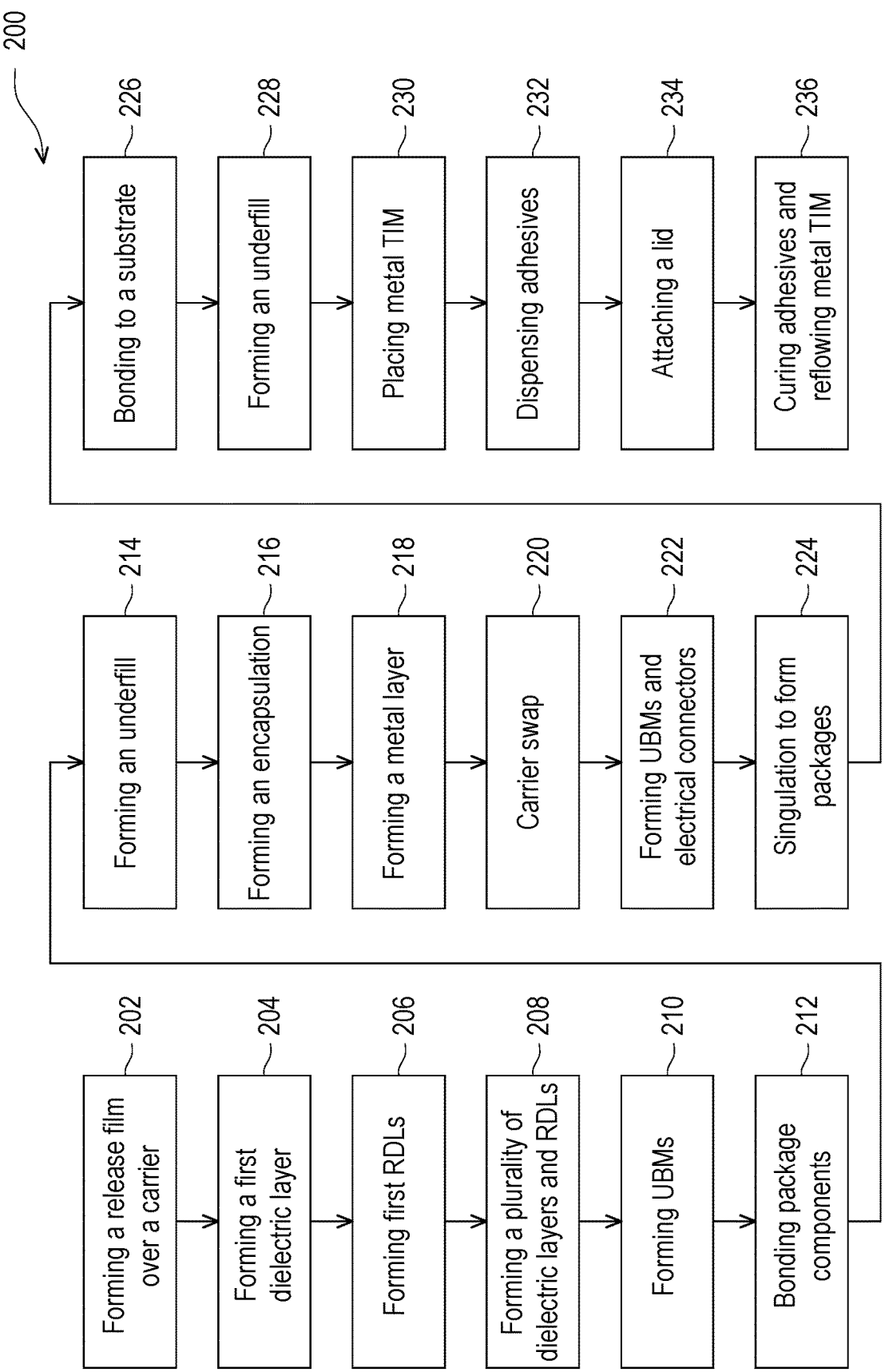
FIG. 21 illustrates a process flow for forming the semiconductor package including two different adhesives in accordance with some embodiments.

FIGS. 1 through 6 illustrate the cross-sectional views of the formation of an interposer 46 (e.g., a build-up interposer) as shown in FIG. 6. Referring to FIG. 1, a release film 22 is formed on a carrier 20. The respective process is illustrated as process 202 in the process flow 200 as shown in FIG. 21. The carrier 20 may be a glass carrier, an organic carrier, or the like. The carrier 20 may have a round top-view shape, and may have a size of a silicon wafer. The release film 22 may be formed of a polymer-based material, such as a light-to-heat-conversion (LTHC) material, which may be removed along with the carrier 20 from the overlying structures that will be formed in subsequent steps. In some embodiments, the release film 22 comprises an epoxy-based thermal-release material. The release film 22 may be coated onto the carrier 20.

An insulating layer 24 is formed on the release film 22. The respective process is illustrated as process 204 in the process flow 200 as shown in FIG. 21. In some embodiments, the insulating layer 24 comprises an organic material (e.g., polybenzoxazole (PBO), polyimide, benzocyclobutene (BCB), or the like) or an inorganic dielectric material (e.g., silicon oxide, silicon nitride, silicon carbide, silicon oxynitride, silicon oxycarbide, silicon oxycarbonitride, Un-doped Silicate Glass (USG), or the like).

Redistribution lines (RDLs) 26 are formed over the insulating layer 24. The respective process is illustrated as process 206 in the process flow 200 as shown in FIG. 21. The formation of the RDLs 26 may include forming a seed layer (not shown) over the insulating layer 24, forming a patterned mask (not shown) such as a photoresist or one or more layers of dielectric material over the seed layer, and plating a conductive material on the exposed seed layer. The patterned mask and the portions of the seed layer covered by the patterned mask are removed. In embodiments in which the photoresist is used as the patterned mask, the patterned mask is removed by an acceptable ashing or stripping process, such as using an oxygen plasma or the like. In embodiments in which the one or more layers of dielectric material are used as the patterned mask, the patterned mask is removed by an acceptable stripping process, such as wet or dry etching. The remaining conductive material and the underlying seed layer may be collectively referred to as the RDLs 26 as shown in FIG. 1. The seed layer and the plated conductive material may be formed of the same material or different materials. The seed layer may be a single metal layer or a composite layer comprising a plurality of sub-layers formed of different metallic materials. In some embodiments, the seed layer may comprise a titanium layer and a copper layer over the titanium layer. The conductive material may be a metal or a metal alloy including aluminum, nickel, copper, titanium, tungsten, and/or alloys thereof. The seed layer may be formed using physical vapor deposition (PVD) or the like. The plating process may be performed using electro chemical plating (ECP), electro-less plating, or the like.

Figure 2:
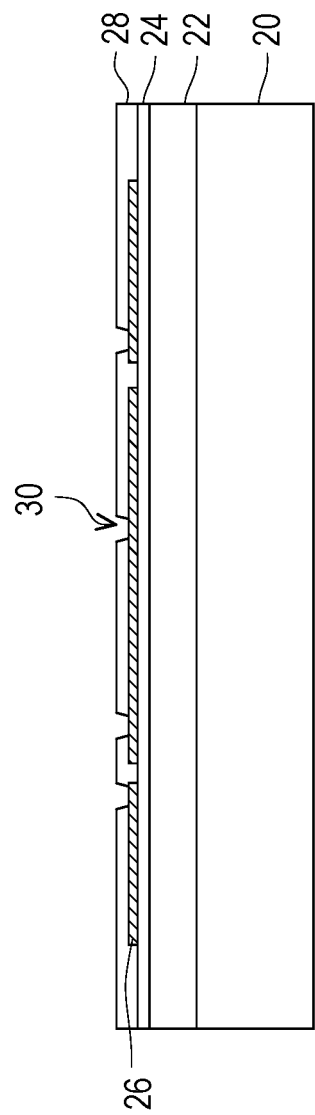

FIGS. 2 through 5 illustrate the formation of one or more additional insulating layers and RDLs. The respective process is illustrated as process 208 in the process flow 200 as shown in FIG. 21. Referring to FIG. 2, an insulating layer 28 is formed and patterned on the RDLs 26. The bottom surface of the insulating layer 28 is in contact with the top surfaces of the RDLs 26 and the insulating layer 24. The insulating layer 28 may comprise an organic or inorganic material, which may be selected from the same group of candidate materials for forming the insulating layer 24. The insulating layer 28 is patterned to form openings 30 in the insulating layer 28 to expose portions of the RDLs 26.

Figure 3:
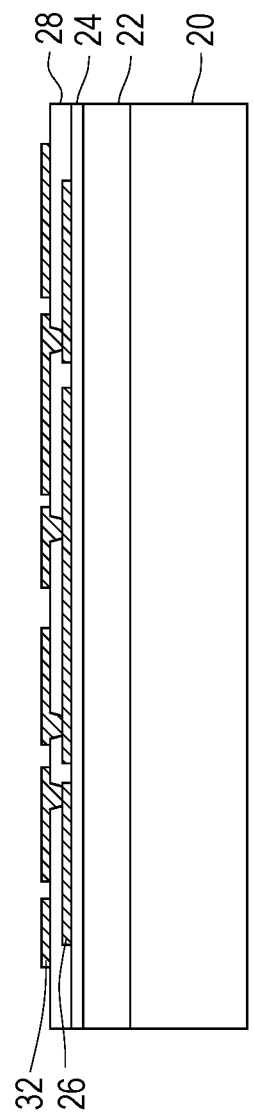

In FIG. 3, RDLs 32 are formed to connect to the RDLs 26. The RDLs 32 may include metal lines over the insulating layer 28. The RDLs 32 may also include metal vias extending into the openings 30 in the insulating layer 28 to connect to a conductive line of the RDLs 26. The RDLs 32 may be formed using the same or similar materials and processes as discussed above with reference to the RDLs 26. In FIG. 4, insulating layer 34 is formed and patterned on the RDLs 32 and the insulating layer 28. The insulating layer 34 may be formed and patterned using the same or similar materials and processes as discussed above with reference to the insulating layer 24.

FIG. 5 illustrates the formation of RDLs 36, which are electrically connected to respective conductive features of the RDLs 32. The RDLs 36 may be formed using the same or similar materials and processes as discussed above with reference to the RDLs 26. Insulating layer 38 is formed on the RDLs 36 and patterned to form openings 40, and some portions of the RDLs 36 are exposed through the openings 40 in the insulating layer 38. The insulating layer 38 may be formed and patterned using the same or similar materials and processes as discussed above with reference to the insulating layer 24. While three layers of the RDLs (26, 32, and 36) are illustrated in FIG. 5 as an example, the structure may have any number of the RDL layers.

FIG. 6 illustrates the formation of conductive pads, such as Under-Bump Metallurgies (UBMs) 42. The respective process is illustrated as process 210 in the process flow 200 as shown in FIG. 21. The locations of the openings 40 (shown in FIG. 5) in the insulating layer 38 may correspond to the locations in which UBMs 42 are to be formed. The UBMs 42 be formed using the same or similar materials and processes as discussed above with reference to the RDLs 26. The insulating layers 24, 28, 34, and 38 and the RDLs 26, 32, and 36 may be referred to as the interposer 46. In some embodiments the conductive pads may comprise conductive pillars.

FIGS. 1 through 6 illustrated an example in which the interposer 46 is a build-up interposer formed on a carrier substrate. Other interposers may be used. In some embodiments, the interposer 46 is a semiconductor interposer, which may include a semiconductor substrate, such as silicon substrate, through-silicon vias that extend through the silicon substrate, and redistribution lines formed on the semiconductor substrate.

Figure 7:
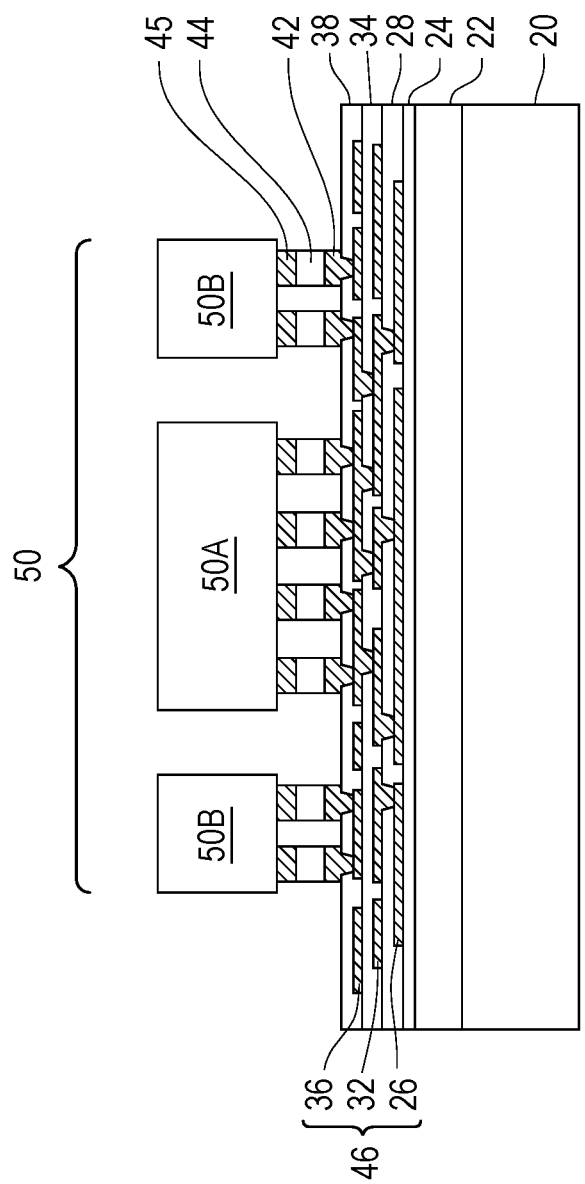

In FIG. 7, package components 50A and 50B (collectively or individually referred to as package components 50) are bonded to the interposer 46. The respective process is illustrated as process 212 in the process flow 200 as shown in FIG. 21. Each of the package components 50 may be one or more device dies, a package with one or more device dies packaged therein, a System-on-Chip (SoC) die including a plurality of device dies packaged as a system, or the like. The device dies in package components 50 may be or may comprise logic dies, memory dies, input-output dies, Integrated Passive Devices (IPDs), or the like, or combinations thereof. For example, the logic device dies in package components 50 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 50 may include Static Random Access Memory (SRAM) dies, Dynamic Random Access Memory (DRAM) dies, or the like. The package components 50 may include external connectors 45. In some embodiments, the package components 50A may represent device dies that have not been packaged prior to attachment to the interposer 46, and the package components 50B may refer to a plurality of stacked device dies that are bonded together prior to attachment to the interposer 46.

Figure 22A:
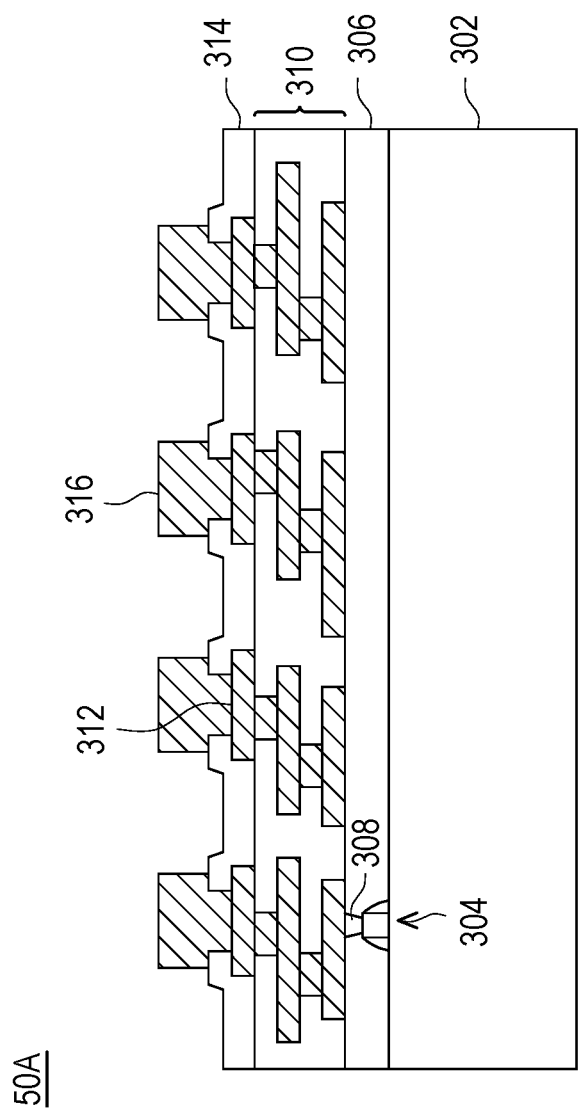
FIGS. 22A and 22B illustrate the cross-sectional views of various semiconductor dies in accordance with some embodiments.

FIG. 22A illustrates a detailed, cross-sectional view of a package component 50A. When the package component 50A is a semiconductor die. The package component 50A may be formed in a wafer, which may include different device regions that are singulated in subsequent steps to form a plurality of integrated circuit dies. The package component 50A may be processed according to applicable manufacturing processes to form integrated circuits. For example, the package component 50A includes a semiconductor substrate 302, such as silicon, doped or undoped, or an active layer of a semiconductor-on-insulator (SOI) substrate. The semiconductor substrate 302 may include other semiconductor materials, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 302 has an active surface (e.g., the surface facing upwards in FIG. 22A), sometimes called a front side, and an inactive surface (e.g., the surface facing downwards in FIG. 22A), sometimes called a back side.

Devices (represented by a transistor) 304 may be formed at the front surface of the semiconductor substrate 302. The devices 304 may be active devices (e.g., transistors, diodes, etc.), capacitors, resistors, etc. An inter-layer dielectric (ILD) 306 is over the front surface of the semiconductor substrate 302. The ILD 306 surrounds and may cover the devices 304. The ILD 306 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 308 extend through the ILD 306 to electrically and physically couple the devices 304. For example, when the devices 304 are transistors, the conductive plugs 308 may couple the gates and source/drain regions of the transistors. Source/drain region(s) may refer to a source or a drain, individually or collectively dependent upon the context. The conductive plugs 308 may be formed of tungsten, cobalt, nickel, copper, silver, gold, aluminum, the like, or combinations thereof. An interconnect structure 310 is over the ILD 306 and conductive plugs 308. The interconnect structure 310 interconnects the devices 304 to form an integrated circuit. The interconnect structure 310 may be formed by, for example, metallization patterns in dielectric layers on the ILD 306. The metallization patterns include metal lines and vias formed in one or more low-k dielectric layers. The metallization patterns of the interconnect structure 310 are electrically coupled to the devices 304 by the conductive plugs 308.

The package component 50A further includes pads 312, such as aluminum pads, to which external connections are made. The pads 312 are on the active side of the package component 50A, such as in and/or on the interconnect structure 310. One or more passivation films 314 are on the package component 50A, such as on portions of the interconnect structure 310 and pads 312. Openings extend through the passivation films 314 to the pads 312. Die connectors 316, such as conductive pillars (for example, formed of a metal such as copper), extend through the openings in the passivation films 314 and are physically and electrically coupled to respective ones of the pads 312. The die connectors 316 may be formed by, for example, plating, or the like. The die connectors 316 electrically couple the respective integrated circuits of the package component 50A.

Figure 22B:
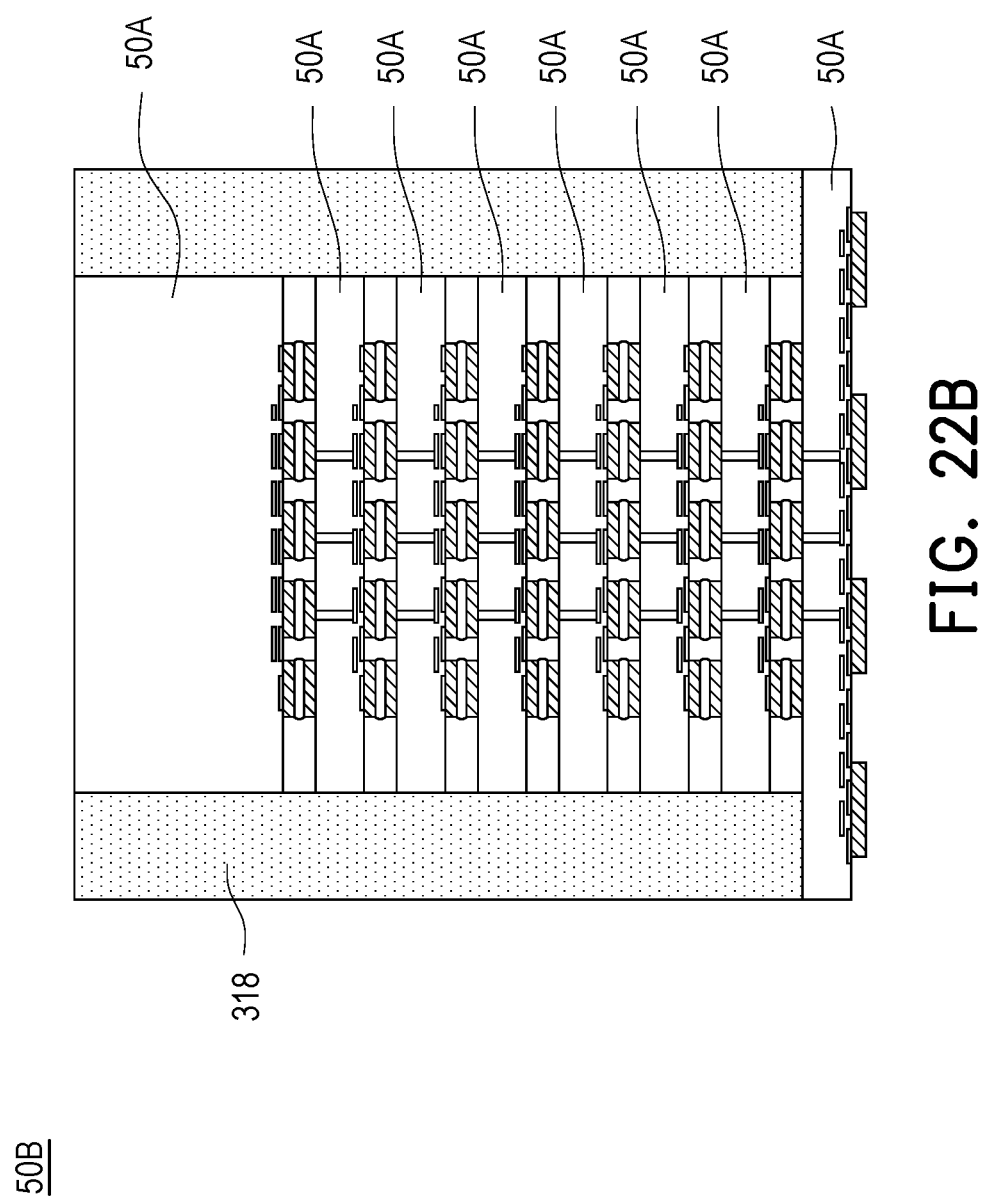

FIG. 22B illustrates a detailed, cross-sectional view of a package component 50B. The package component 50B may be a stacked device that includes multiple package components 50A. Each of the package components 50A may include a semiconductor substrate having active devices formed thereon. For example, the package component 50B may be a memory device such as a hybrid memory cube (HMC) module, a high bandwidth memory (HBM) module, or the like that includes multiple memory dies. In such embodiments, the package component 50B includes multiple semiconductor substrates interconnected by through-substrate vias (TSVs) that extend through each of the semiconductor substrates. Each of the semiconductor substrates may (or may not) have an interconnect structure formed thereon. Further, upper ones of the package components 50A in the package component 50B may be encapsulated by a molding compound 318.

Referring back to FIG. 7, in some embodiments, the package components 50 are bonded to the interposer 46 using electrical connectors 44. In some embodiments, the electrical connectors 44 may be solder balls. In some embodiments, the electrical connectors 44 may be non-solder metal pillars, or metal pillars and solder caps over the non-solder metal pillars, which may be formed through a plating process. Other types of bonding, such as metal-to-metal bonding, a combination of dielectric-to-dielectric bonding and metal-to-metal bonding, or the like may also be used. FIG. 7 shows a portion of the interposer 46 and the carrier 20 with three package components 50 attached to the interposer 46 for illustrative purposes. The interposer 46 may extend over a larger portion of the carrier 20, other package components may be bonded to the interposer 46 over other portions of the carrier 20.

Figure 8:
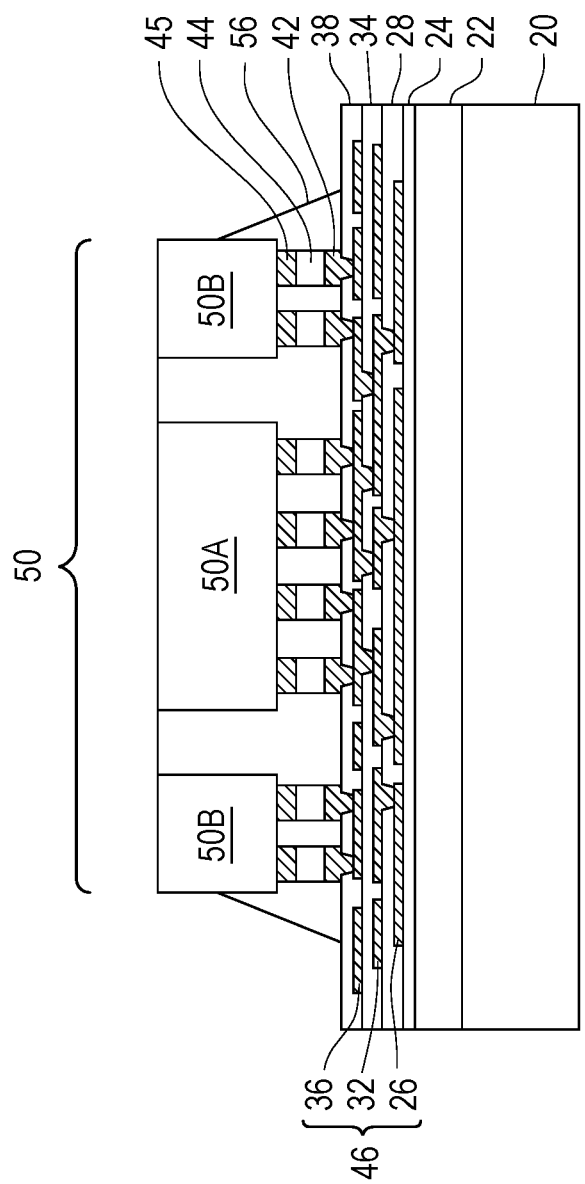

In FIG. 8, an underfill 56 is formed between the package components 50 and interposer 46 to reduce stress and protect the joints between the package components 50 and interposer 46, such as electrical connectors 44. The respective process is illustrated as process 214 in the process flow 200 as shown in FIG. 21. The underfill 56 may include a base material, such as an epoxy, and filler particles in the epoxy. The underfill 56 may be deposited by a capillary flow process after the package components 50 are bonded to the interposer 46 or may be formed by a suitable deposition method before the package components 50 are bonded to the interposer 46. For example, the underfill 56 may be dispensed from one side of the package components 50, and flow into the gaps between the package components 50 and the interposer 46 through capillary action. Underfill 56 may be subsequently cured.

Figure 9:
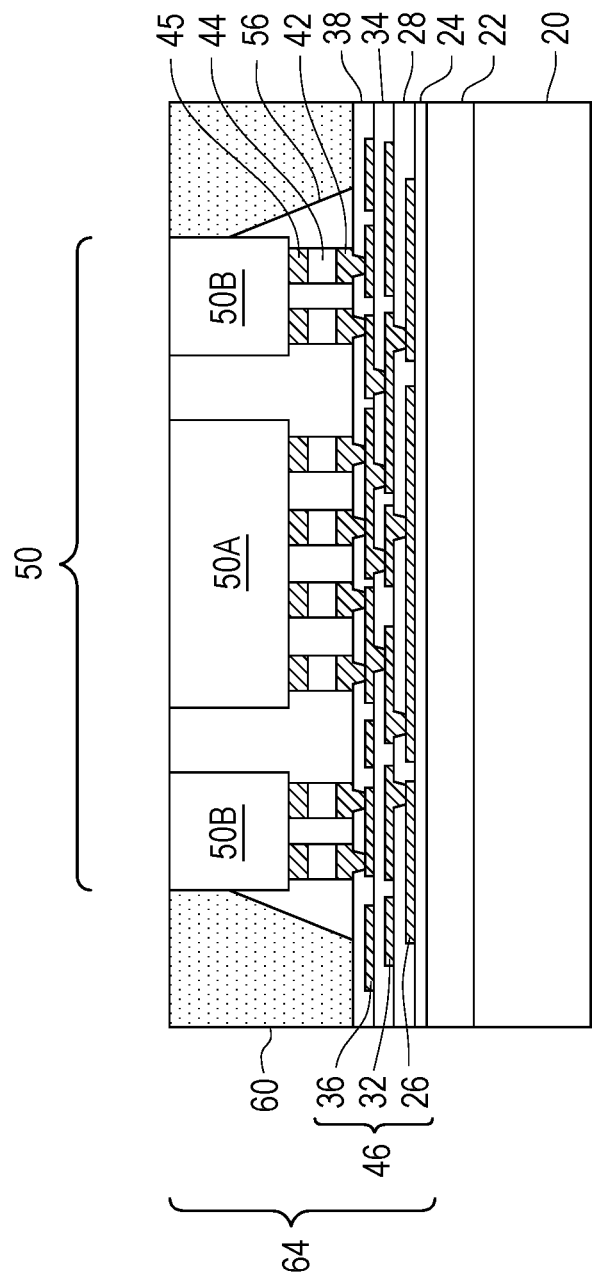

In FIG. 9, the package components 50 are encapsulated in encapsulant 60. The respective process is illustrated as process 216 in the process flow 200 as shown in FIG. 21. The encapsulant 60 covers the package components 50 and may fill the gaps, if any, between the neighboring package components 50 bonded to the interposer 46. The encapsulant 60 may comprise a molding compound, a molding underfill, an epoxy, a resin, or the like. In some embodiments, the encapsulant 60 may include a base material, which may be a polymer, a resin, an epoxy, or the like, and filler particles in the base material. The filler particles may include dielectric particles of silicon oxide, aluminum oxide, silica, or the like, and may have spherical shapes. Also, the spherical filler particles may have the same or different diameters. The encapsulant 60 may be applied by compression molding, transfer molding, or the like. The encapsulant 60 may be applied in liquid or semi-liquid form and subsequently cured.

A planarization process may be performed on the encapsulant 60 to expose top surfaces of the package components 50. The top surfaces of the package components 50 and the encapsulant 60 are substantially coplanar after the planarization process within process variations and the encapsulant 60 may encircle the package components 50 in a top view. The planarization process may be a chemical-mechanical polish (CMP), a grinding process, or the like. In some embodiments, the planarization may be omitted. In some embodiments, the encapsulant 60 may remain over the package components 50. The package components 50, the interposer 46, the underfill 56, and/or the encapsulant 60 may be collectively referred to as a wafer structure 64.

Figure 10A:
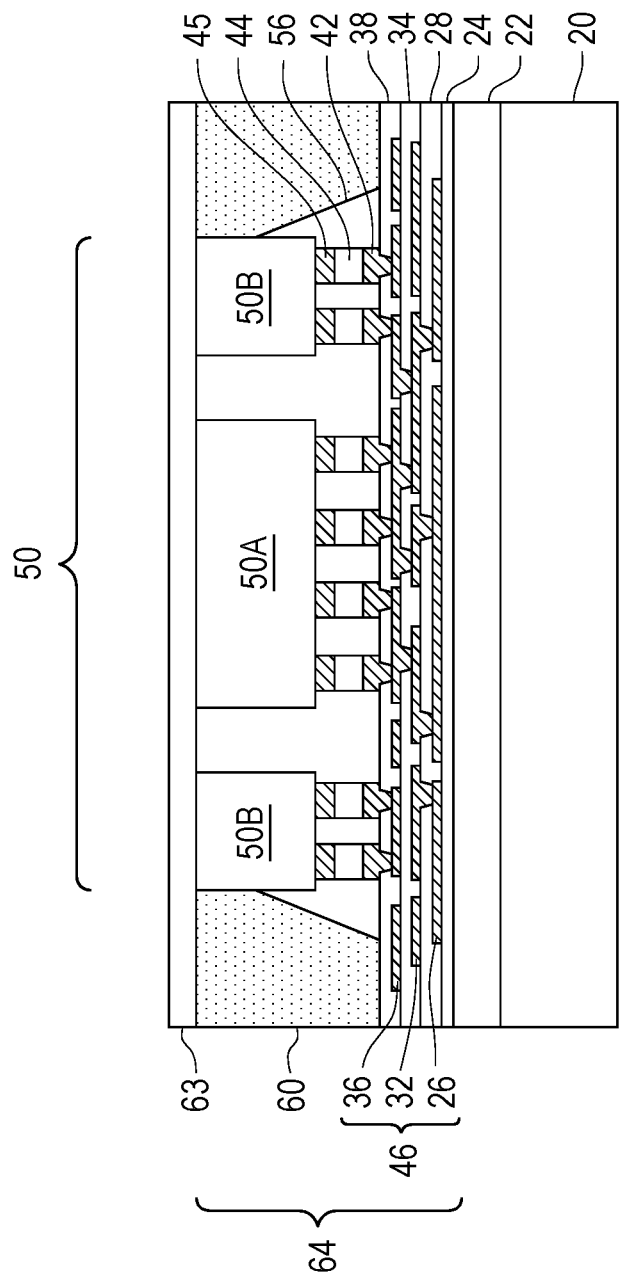

In FIG. 10A, a metal layer 63 is formed on the top surfaces of the encapsulant 60 and the package components 50. The respective process is illustrated as process 218 in the process flow 200 as shown in FIG. 21. As discussed in greater detail below, the metal layer 63 may bond with a thermal interface material (TIM) in a subsequent step and transfer heat generated by the package components 50 during operation away from the package structure 64'. As a result, the metal layer 63 may facilitate heat dissipation in the completed semiconductor package. In some embodiments, the metal layer 63 may comprise one or more sub-layers (shown in FIG. 10B) formed of different metals, such as aluminum, titanium, nickel, vanadium, gold, or the like. The metal layer 63 may have a thickness in a range from about 0.6 µm to about 0.9 µm, such as 0.75 µm. Each sub-layer may be formed using a corresponding deposition process, such as PVD, chemical vapor deposition (CVD), atomic layer deposition (ALD), or the like.

Figure 10B:
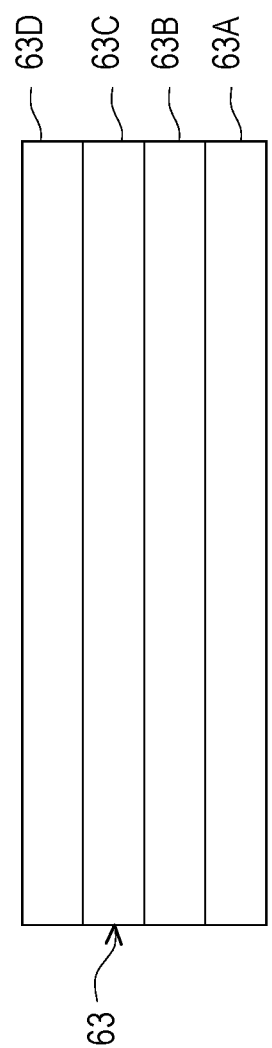

FIG. 10B illustrates a detailed view the metal layer 63 comprising four sub-layers in accordance with some embodiments. A first sub-layer 63A comprising aluminum may be formed on the top surfaces of the encapsulant 60 and the package components 50, wherein a thickness of the first sub-layer 63A may be about 0.2 μm. A second sub-layer 63B of titanium may be formed on the first sub-layer 63A, wherein a thickness of the second sub-layer 63B may be about 0.1 μm. A third sub-layer 63C of nickel-vanadium alloy may be formed on the second sub-layer 63B, wherein a thickness of the third sub-layer 63C may be about 0.35 μm. A fourth sub-layer 63D of gold may be formed on the third sub-layer 63C, wherein a thickness of the fourth sub-layer 63D may be about 0.1 μm. Other configurations may be used.

Figure 11:
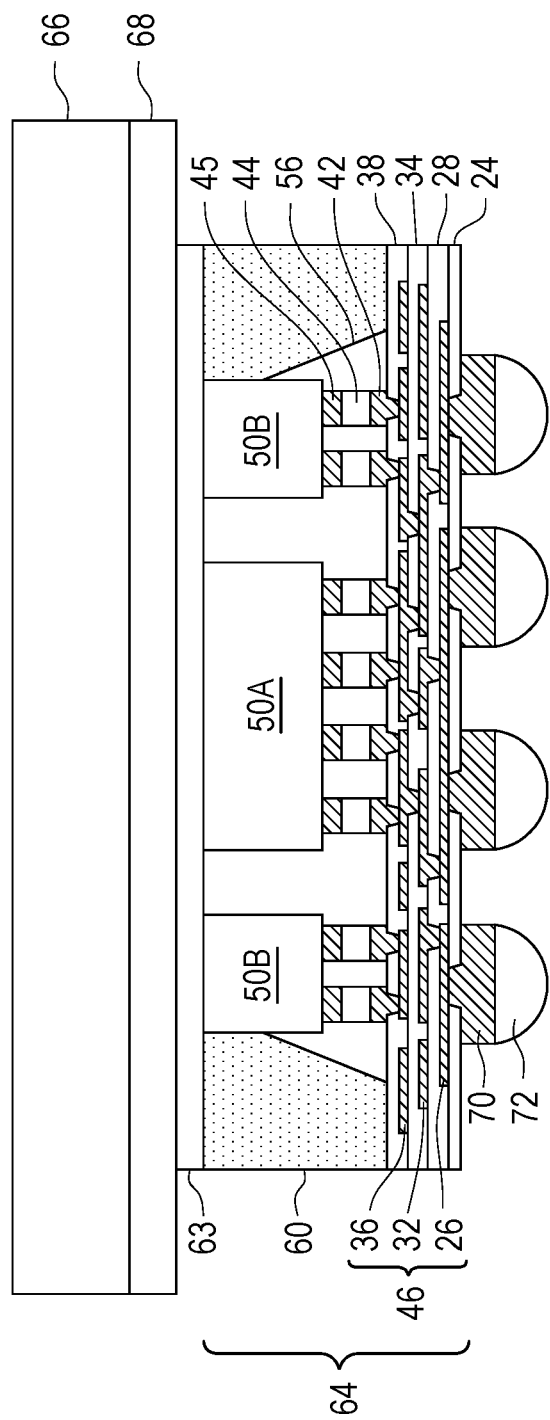

FIG. 11 illustrates a carrier swap and the formation of bottom-side electrical connectors on the bottom side of the interposer 46. The respective process is illustrated as process 220 in the process flow 200 as shown in FIG. 21. A carrier 66 is attached to an upper surface of the metal layer 63 using release film 68, such as an LTHC material. Carrier 20 (shown in FIG. 10), is detached from the wafer structure 64. In embodiments in which the release film 22 comprises an LTHC material, the detaching process may include projecting a light beam, such as a laser beam, on the release film 22 through the carrier 20, which may be transparent. As a result of the light exposure the release film 22 is decomposed, and the carrier 20 may be lifted off from the release film 22. The corresponding process is also referred to as the de-bonding.

As a result of the de-bonding process, the insulating layer 24 is revealed. The UBMs 70 and the electrical connectors 72 are formed on interposer 46 to provide an electrical connection to the package components 50. The respective process is illustrated as process 222 in the process flow 200 as shown in FIG. 21. The formation process may include patterning the insulating layer 24 to form openings exposing conductive pads formed in the RDLs 26. The UBMs 70 extend into the openings in the insulating layer 24 and are formed on the exposed conductive pads. The UBMs 70 may be formed using the same or similar materials and processes as discussed above with reference to the RDLs 26. Electrical connectors 72 are formed on UBMs 70. In some embodiments, the formation of the electrical connectors 72 may include placing solder balls on the exposed portions of UBMs 70, and reflowing the solder ball. In some embodiments, the electrical connectors 72 may be non-solder metal pillars, or metal pillars and solder caps over the non-solder metal pillars.

Figure 12:
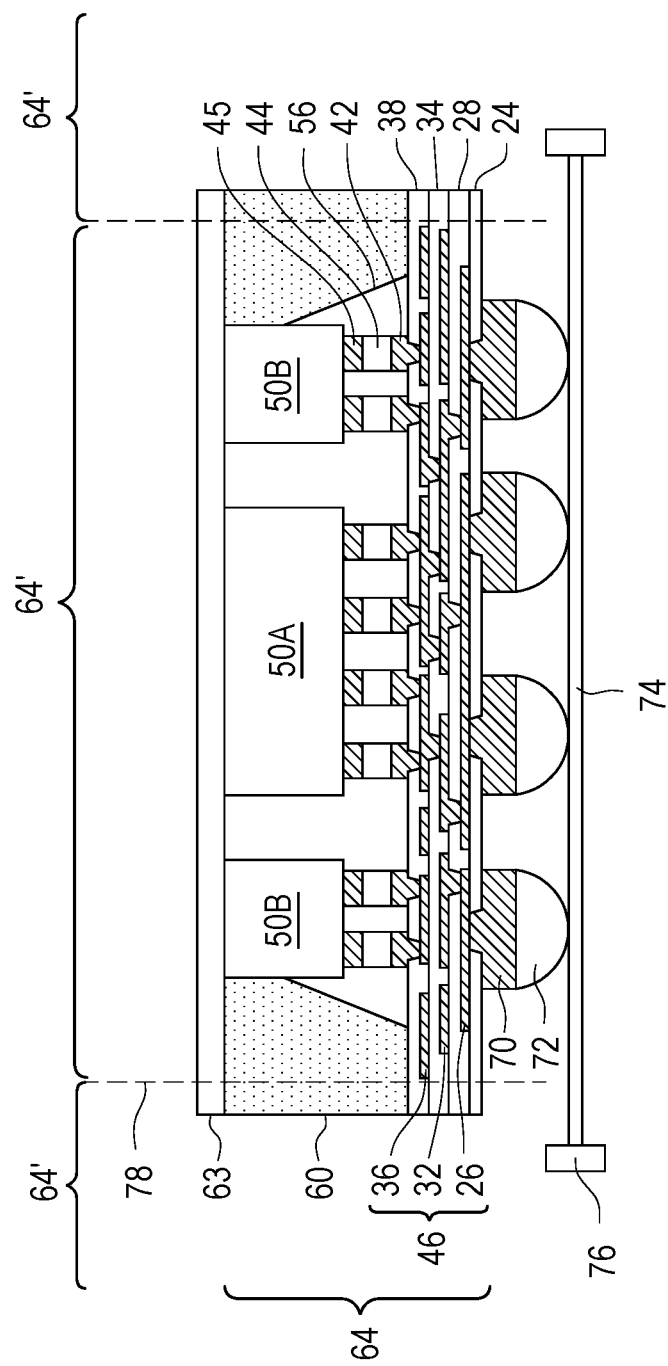

In FIG. 12, the wafer structure 64 is demounted from the carrier 66 (shown in FIG. 11), for example, by projecting a laser beam on the release film 68, so that the release film 68 decomposes. The wafer structure 64 is placed on a tape 74 supported by a frame 76. The wafer structure 64 is singulated along scribe lines 78, so that the wafer structure 64 is separated into discrete package structures 64'. The respective process is illustrated as process 224 in the process flow 200 as shown in FIG. 21. FIG. 12 illustrates three package components 50 in the package structure 64' as an example, any number of the package component 50 may be in package structure 64'.

Figure 13:
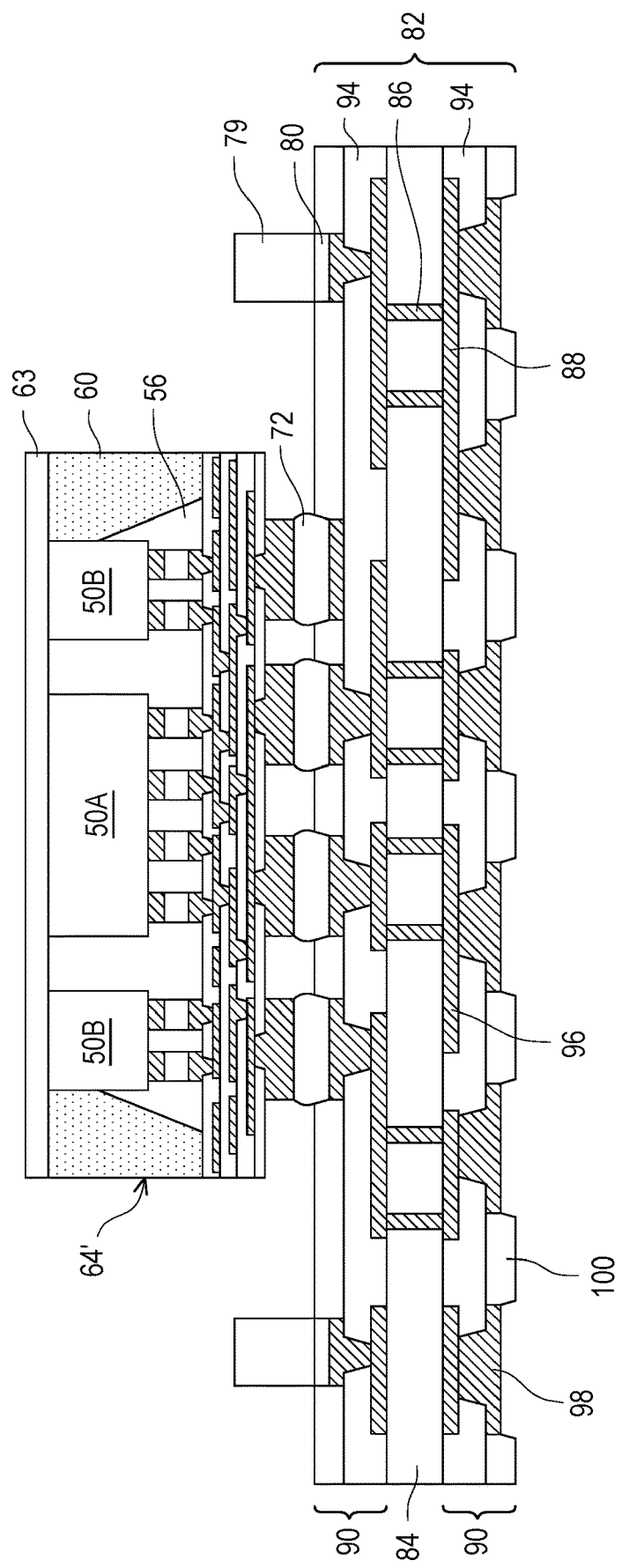

In FIG. 13, the package structure 64' is bonded with the substrate 82. The bonding is via the electrical connectors 72, which may include solder balls. The respective process is illustrated as process 226 in the process flow 200 as shown in FIG. 21. The substrate 82 may be or may comprise an interposer, a package, a core substrate, a coreless substrate, a printed circuit board, or the like. FIG. 13, shows the substrate 82 as a core substrate, including core material 84, through vias 86, fill material 88, redistribution structures 90. Each redistribution structure 90 may comprise a dielectric layer 94, metallization patterns 96, UBMs 98, and solder resists 100. Each redistribution structure 90 may have more dielectric layers 94 and metallization patterns 96 than shown in FIG. 13. In some embodiments, the substrate 82 may have surface mount devices (SMDs) 79 bonded to the substrate 82 via electrical connectors 80 The SMDs 79 may be an integrated passive device (IPD), such a 2-terminal IPD, a multi-terminal IPD, or other type of passive device. The SMDs 79 may comprise capacitors, resistors, inductors, the like, or a combination thereof. FIG. 13 shows the SMDs 79 bonded to the substrate 82 before the package structure 64' is bonded to the substrate 82 as an example, the SMDs 79 may be bonded to the substrate 82 after the package structure 64' is bonded to the substrate 82. FIG. 13 shows two SMDs 79 bonded to the substrate 82 as an example, other numbers of SMDs 79 may be bonded to the substrate 82.

Figure 14:
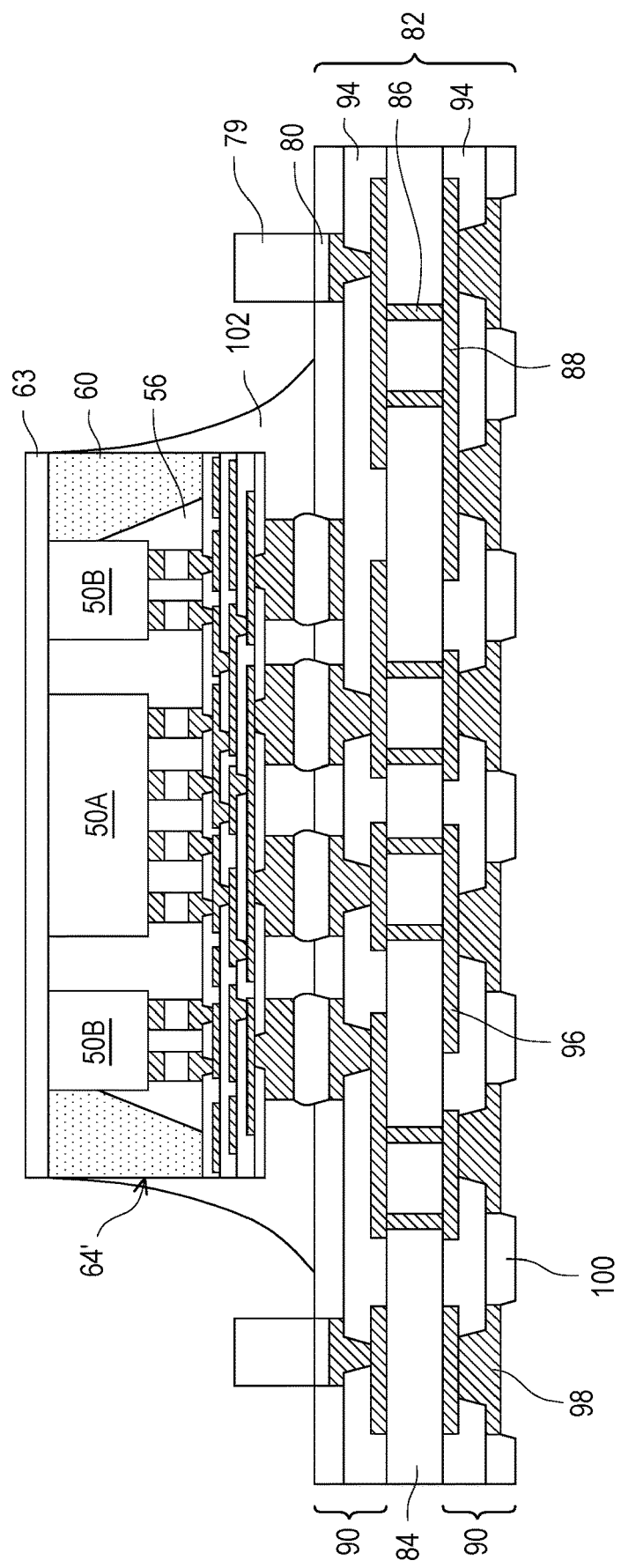

In FIG. 14, an underfill 102 is formed between the package structure 64' and the substrate 82 to reduce stress and protect the joints between the package structure 64' and the substrate 82, such as the electrical connectors 72. The respective process is illustrated as process 228 in the process flow 200 as shown in FIG. 21. In some embodiments, the underfill 102 may extend on sidewalls of the encapsulant 60. The underfill 102 may include a base material, such as an epoxy, and filler particles in the epoxy. The underfill 102 may be deposited by a capillary flow process. For example, the underfill 102 may be dispensed from one side of the package structure 64', and flow into gaps between the package structure 64' and the substrate 82 through capillary action. The underfill 102 may be subsequently cured. FIG. 14 illustrates the underfill 102 has curved sidewalls as an example, the sidewalls of the underfill 102 may have other shapes.

Figure 15:
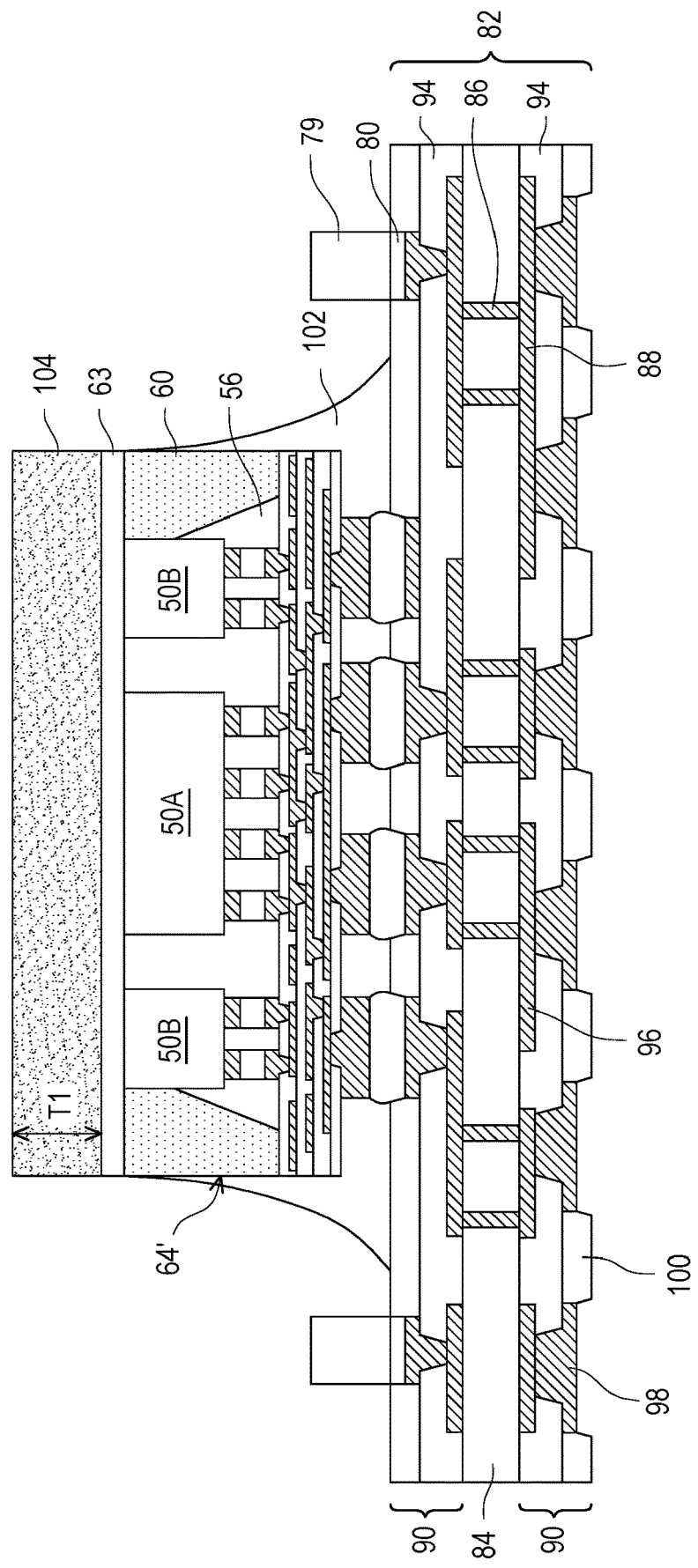

In FIG. 15, a thermal interface material (TIM) 104 is placed on the metal layer 63. The respective process is illustrated as process 230 in the process flow 200 as shown in FIG. 21. The TIM 104 may be a heat transfer layer and may transfer heat away from the metal layer 63. As a result, the TIM 104 may facilitate heat dissipation in the completed semiconductor package. The TIM 104 may comprise a metallic material, such as a metal or metal alloy with a melting temperature in a range from about 160° C. to about 260° C., such as indium, indium-silver alloy, tin-copper alloy, indium-silver-copper alloy (e.g., SAC305), or the like. The TIM 104 may have a thickness T1 in a range from about 100 μm to about 300 μm, such as 200 μm. A flux, such as a no-clean flux may be dispensed on the metal layer 63 before the TIM 104 is placed on the metal layer 63 and on the TIM 104 after the TIM 104 is placed on the metal layer 63. The flux may help the TIM 104 to bond with the metal layer 63 underneath and a subsequently attached lid above, as discussed in greater detail below.

Figure 16:
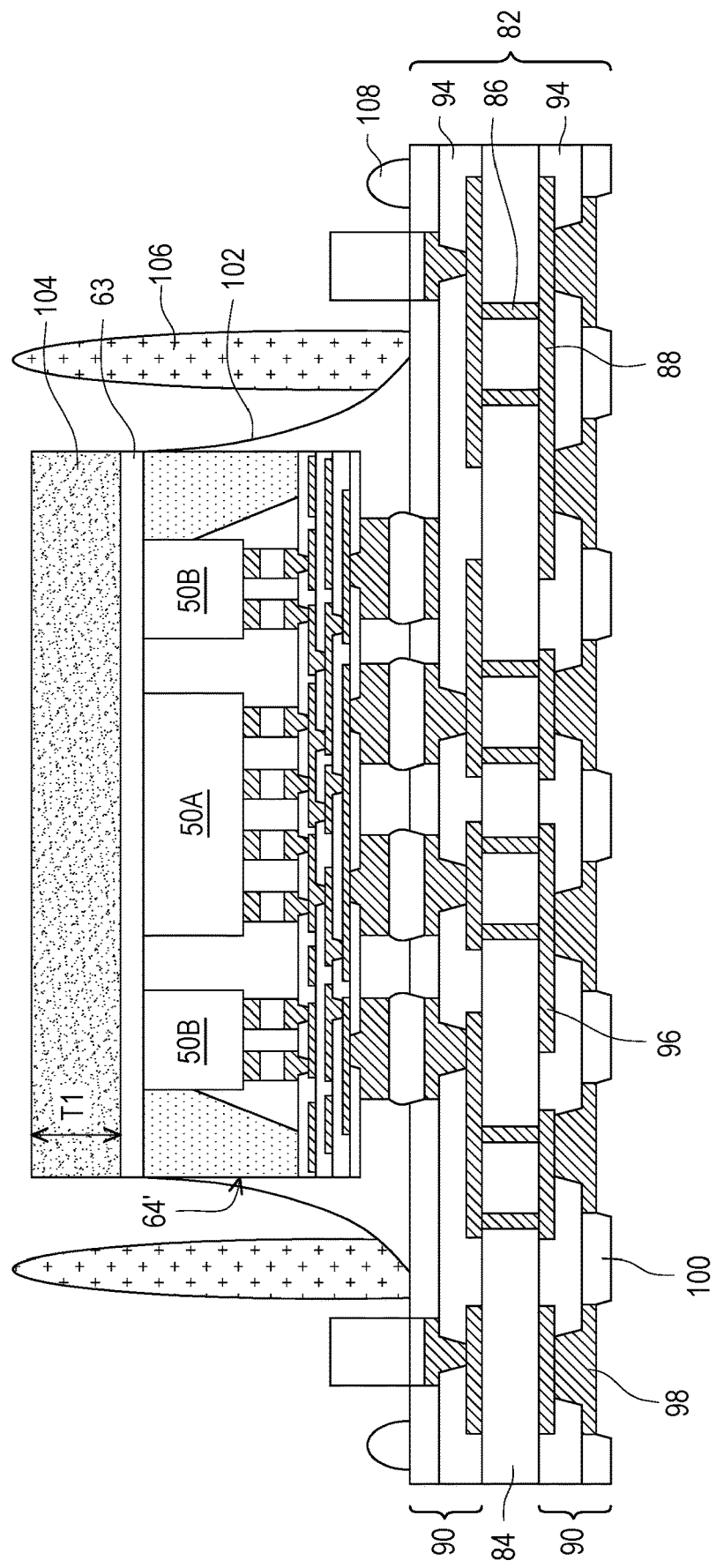

In FIG. 16, a first adhesive 106 and a second adhesive 108 are dispensed on the substrate 82. The respective process is illustrated as process 232 in the process flow 200 as shown in FIG. 21. As discussed in greater detail below, the first adhesive 106 may provide support to the subsequently attached lid and create a seal with the lid that confines the TIM 104, and the second adhesive 108 may attach the lid to the substrate 82. The first adhesive 106 may be dispensed before the second adhesive 108 or after the second adhesive 108. The first adhesive 106 and the second adhesive 108 may have different chemical compositions. The first adhesive 106 may comprise silicone, which may make up about 10% to about 30% of the first adhesive 106, and a filler material (e.g., aluminum oxide), which may make up about 70% to about 90% of the first adhesive 106. In some embodiments, the second adhesive 108 may comprise silicone, which may make up about 70% to about 90% of the second adhesive 108, and a filler material (e.g., silica), which may make up about 10% to about 30% of the second adhesive 108. In some embodiments, the first adhesive 106 may comprise less silicone than the second adhesive 108. As shown in FIG. 16, the first adhesive 106 is disposed on both the substrate 82 and the underfill 102. As discussed in greater detail below with respect to FIG. 18D, the first adhesive 106 may be a singular feature that encircles the package structure 64' in a top view, and the second adhesive 108 may comprise multiple discrete parts that partially surround the first adhesive 106 in the top view.

Figure 17:
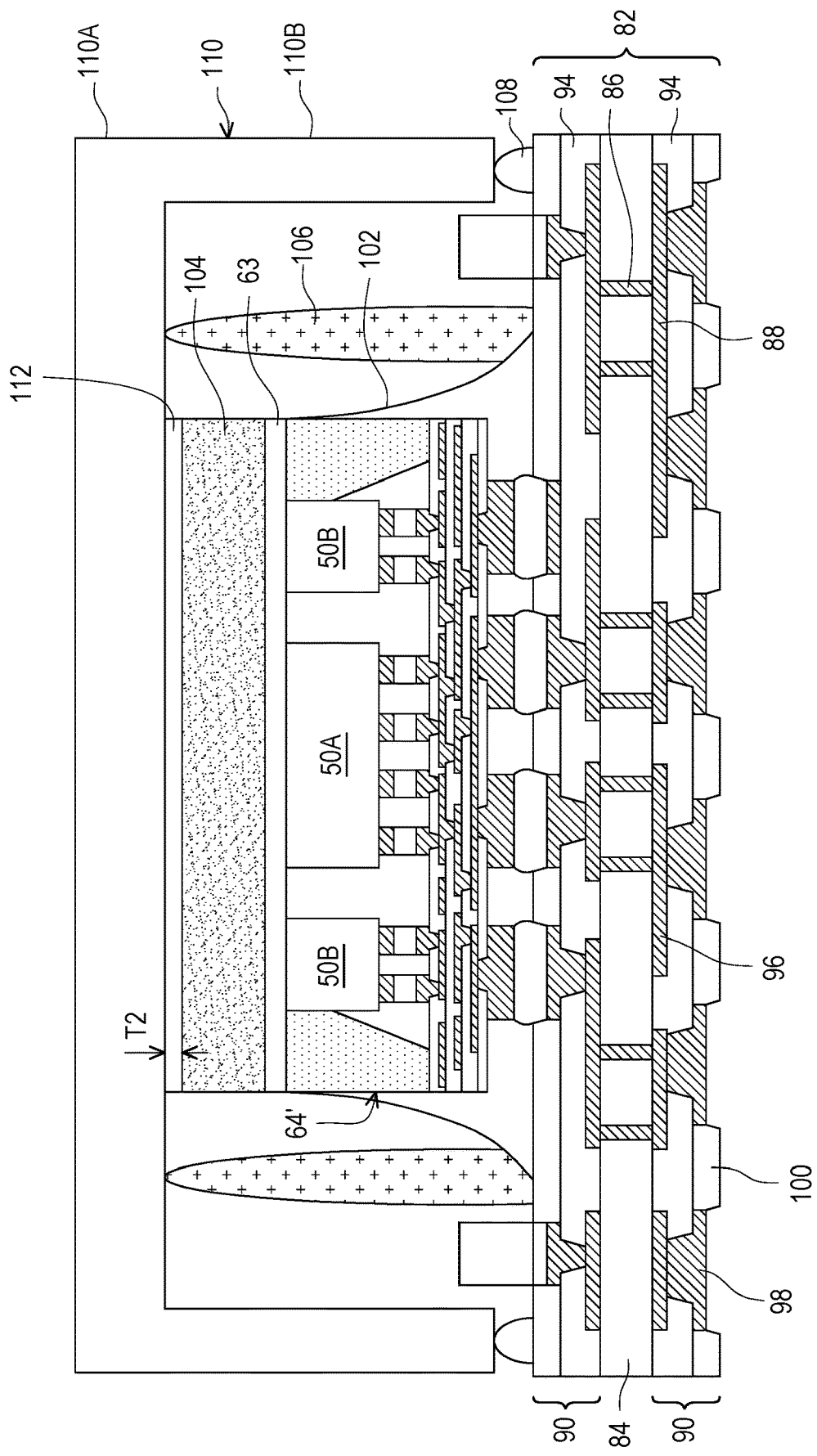

In FIG. 17, a lid 110 is attached to the substrate 82. The respective process is illustrated as process 234 in the process flow 200 as shown in FIG. 21. The lid 110 may dissipate the heat transferred to the lid 110 by the TIM 104. The lid 110 may comprise heat conductive materials, such as copper, nickel, or the like. In some embodiments, the lid 110 may comprise a core 110C (shown in FIG. 18B), which may comprise copper or the like, and a coating layer 110D (shown in FIG. 18B), which may comprise nickel or the like. The coating layer 110D may have a thickness in a range from 5 µm to 10 µm. The lid 110 may which comprises a top portion 110A and bottom portion 110B. The top portion 110A may cover most of the area of the substrate 82 in a top view and the bottom portion may encircle the package structure 64' and the second adhesive 108 in the top view. A bottom surface of the top portion 110A may have a metal layer 112 disposed thereon. The metal layer 112 may have a size (e.g., surface area) similar to the size of the TIM 104 in the top view and a thickness T2 in a range from about 0.05 µm to about 0.2 µm, such as 0.1 µm. The metal layer 112 may comprise gold or the like, and may be deposited on the top portion 110A by ECP, PVD, CVD, ALD, or the like. In some embodiments, after the metal layer 112 is deposited, a patterning process (e.g., photolithography and etching) may be performed to remove excess portions of the metal layer 112 from the lid 110. Alternatively, a patterned mask (not shown) may be deposited on the lid 110 prior to depositing the metal layer 112, and the metal layer 112 may be selectively deposited in openings of the patterned mask. In some embodiments, the metal layer 112 may be blanket deposited and the patterning process may be omitted. As such, the metal layer 112 may cover an entire surface of the lid 110 that faces the TIM 104, and the metal layer 112 may have a larger surface area than the TIM 104. The metal layer 112 may be placed in contact with a top surface of the TIM 104, the exposed portions of the bottom surface of the top portion 110A may be placed in contact with a top surface of the first adhesive 106, and a bottom surface of the bottom portion 110B may be placed in contact with top surfaces of the second adhesive 108.

Figure 18A:
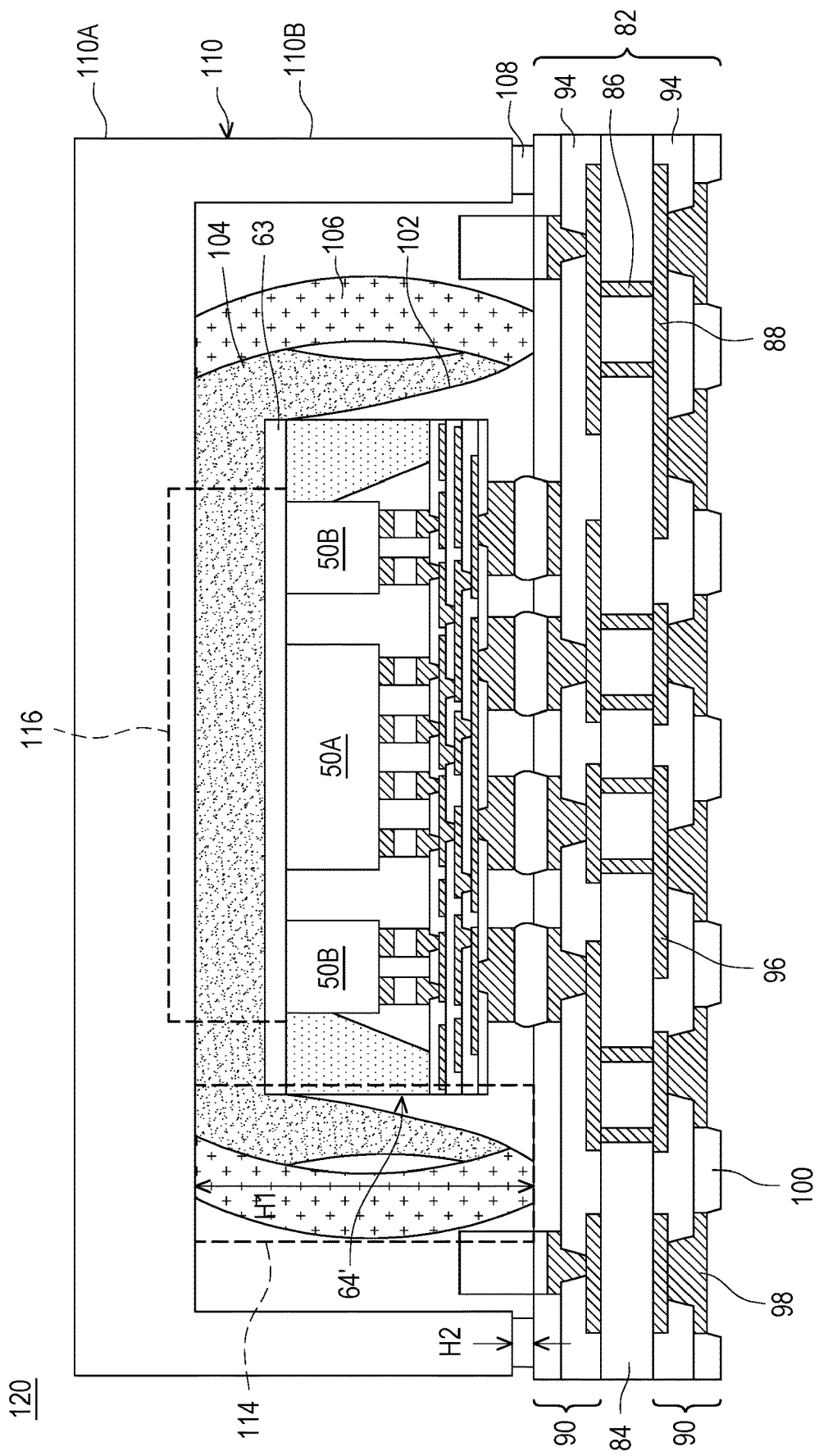

In FIG. 18A, the first adhesive 106 and the second adhesive 108 are cured and the TIM 104 are reflowed to adhere the lid 110 to the substrate 82 and the TIM 104. The metal layer 112 and the fourth sub-layer 63D of the metal layer 63 may be completely consumed by reactions during the reflowing process, as discussed in greater detail below. The respective process is illustrated as process 236 in the process flow 200 as shown in FIG. 21. The first adhesive 106 and the second adhesive 108 may be cured in an ambient atmosphere at a temperate in a range from about 120° C. to about 140° C., such as 130° C. During the curing of the first adhesive 106 and the second adhesive 108, compressive pressure may be applied to top surfaces and bottom surfaces of the first adhesive 106 and the second adhesive 108. After curing, the first adhesive 106 may change shape and comprise a concave inner sidewall and a convex outer sidewall, and the first adhesive 106, the lid 110, the package structure 64', and the underfill 102 may form a seal that confines the TIM 104. As discussed in greater detail below, the seal that confines the TIM 104 may to reduce the quantity and sizes of voids in the TIM 104 during a subsequent reflowing process.

After curing, the first adhesive 106 may have a first Young's Modulus E1 in a range from about 10 MPa to about 100 MPa, such as 50 MPa. With the first Young's Modulus E1 of the first adhesive 106 in such range, the first adhesive 106 may provide support to the lid 110, which may mitigate the warping of the lid 110. As a result, the bonding between the TIM 104 and the lid 110 as well as the bonding between the TIM 104 and the metal layer 63, which is discussed in greater detail below, may be improved. After curing, the second adhesive 108 may have a second Young's Modulus E2 in a range from about 1 MPa to about 10 MPa, such as 5 MPa. With the second Young's Modulus E2 of the second adhesive 108 in such range, the second adhesive 108 may mitigate the mismatch between the coefficient of thermal expansion (CTE) of the lid 110 and the CTE of the substrate 82. As a result, the cracking of the package structure 64' may be prevented or reduced, thereby improving the long-term reliability of the semiconductor package. In some embodiments, the first Young's Modulus E1 of the first adhesive 106 is larger than the second Young's Modulus E2 of the second adhesive 108, and thus the first adhesive 106 may have a higher stiffness than the second adhesive 108. The first adhesive 106 may have a height H1 in a range from about 0.8 mm to 1.1 mm, such as 1 mm, and the second adhesive 108 may have a height H2 in a range from about 0.05 mm to 0.3 mm, such as 0.2 mm.

Figure 18B:
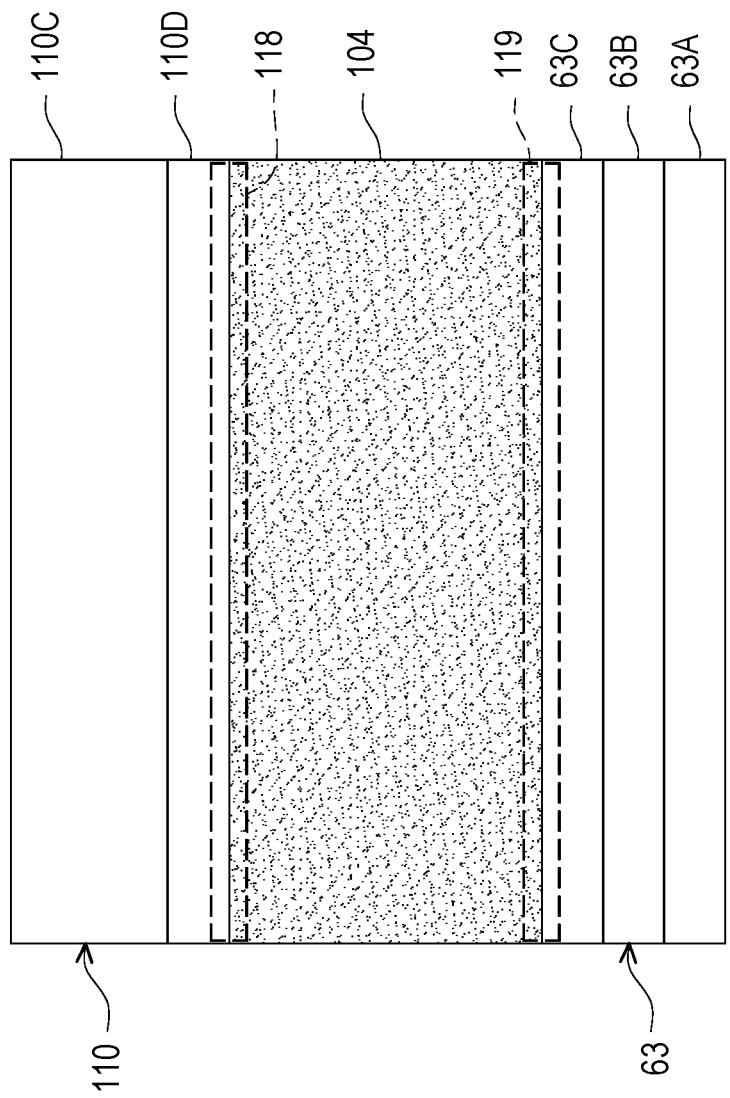

The TIM 104 may be reflowed at a temperate in a range from about 160° C. to about 260° C., such as 180° C. or 250° C. The TIM 104 may be reflowed in an ambient atmosphere or in a nitrogen atmosphere. During the reflowing process, the TIM 104 may melt and bond with the lid 110 above and the metal layer 63 underneath by metal-to-metal bonding, which provides a heat transfer pathway from the package components 50 to the lid 110. FIG. 18B shows a portion of the semiconductor package 120 referred to as a region 116 in FIG. 18A with more details of an interface between the TIM 104 and the lid 110 as well as an interface between the TIM 104 and the metal layer 63. During the reflowing process, the metallic materials in the TIM 104, the metal layer 112 (shown in FIG. 17), and the coating layer 110D of the lid 110 may react with each other and form inter-metallic compounds in a region 118 at the interface between the TIM 104 and the lid 110. Such reactions may completely consume the metal layer 112. Furthermore, during the reflowing process, the metallic materials in the TIM 104, the fourth sub-layer 63D of the metal layer 63, and the third sub-layer 63C of the metal layer 63 may react with each other and form inter-metallic compounds in a region 119 at the interface between the TIM 104 and the metal layer 63. Such reactions may completely consume the fourth sub-layer 63D of the metal layer 63. As a result, the TIM 104 may be in contact with the coating layer 110D of the lid 110 and the third sub-layer 63C of the metal layer 63 after the reflowing process. The configuration of FIG. 18B corresponds to the detailed configuration of the metal layer 63 illustrated in FIG. 10B, other configurations of the metal layer 63 are also possible.

Referring back to FIG. 18A, the support provided by the first adhesive 106 to the lid 110 may mitigate the warping of the lid 110, which improves the bonding between the TIM 104 and the metal layer 63 as well as the bonding between the TIM 104 and the lid 110, thereby improving the heat transfer efficiencies from the metal layer 63 to the TIM 104 and from the TIM 104 to the lid 110, respectively. Since the TIM 104 is confined in the seal formed by the first adhesive 106, the lid 110, the package structure 64', and the underfill 102, the heating during the reflowing process may create a high pressure in the seal, which may reduce the quantity and sizes of voids in the TIM 104 during the reflowing process, thereby improving the heat transfer capacity of the TIM 104. As a result the long-term reliability of the semiconductor package may be improved.

After reflowing process, the TIM 104 may change thickness and shape, and may extend on the underfill 102 and the inner sidewall of the first adhesive 106, as shown in FIG. 18A. In some embodiments, the underfill 102 may be completely covered by the first adhesive 106 and the TIM 104. One or more air gaps may be disposed between the TIM 104 and the inner sidewall of the first adhesive 106. FIG. 18A illustrates sidewalls of the package structure 64' being completely covered by the underfill 102 as an example. In the embodiments where sidewalls of the package structure 64' are not completely covered by the underfill 102, the TIM 104 may extend on the package structure 64', such as on the interposer 46 and/or the encapsulant 60. The structure shown in FIG. 18A may be referred to as semiconductor package 120.

Figure 18C:
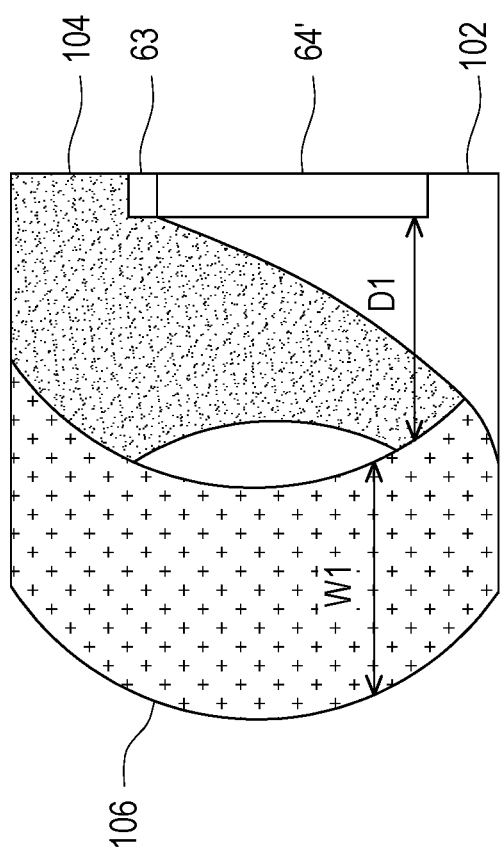

FIG. 18C shows a portion of the semiconductor package 120 referred to as a region 114 in FIG. 18A. The first adhesive 106 may have a width W1, which is a smallest horizontal distance between the inner sidewall and the outer sidewall of the first adhesive 106. The width W1 may be in a range from about 1 mm to about 3 mm. When the width W1 is greater than 1 mm, the first adhesive 106 may be prevented from breaking by the high pressure created during the reflowing process as discussed above. The first adhesive 106 may be spaced apart from the package structure 64' by a distance D1, which is a smallest horizontal distance between the inner sidewall of the first adhesive 106 and an outer sidewall of the package structure 64'. The distance D1 may be in a range from about 1 mm to about 3 mm. When the distance D1 is greater than 1 mm, the first adhesive 106 may be prevented from breaking by the melted TIM 104 during the reflowing process as discussed above.

Figure 18D:
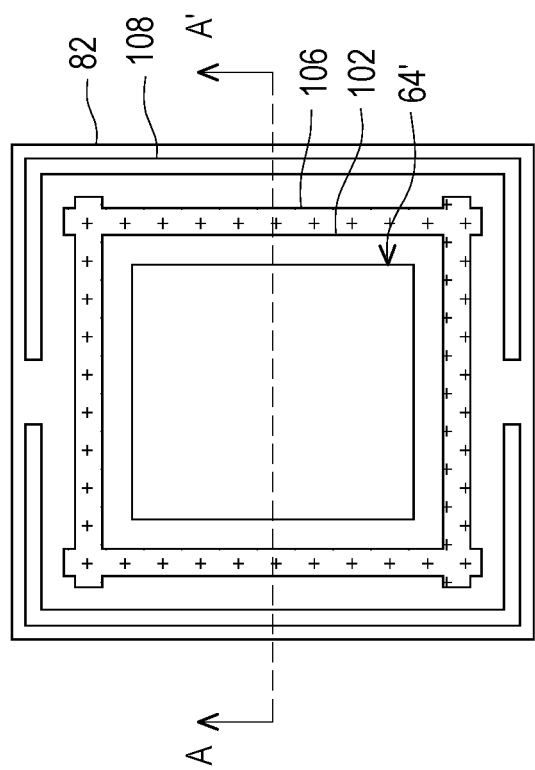

FIG. 18D shows a top view of the semiconductor package 120 shown in FIG. 18A, wherein like reference numerals refer to like features. The cross-sectional view of the semiconductor package 120 shown in FIG. 18A may be obtained from the reference cross-section A-A' in the top view of the semiconductor package 120 shown in FIG. 18D, wherein the lid 110, the TIM 104, and the metal layer 63 are omitted for illustrative purposes. As shown in FIG. 18D, the first adhesive 106 may a singular feature, which may be in a shape of a frame and encircles the package structure 64'. The first adhesive 106 may comprise four segments, wherein each segment intersects with two neighboring segments and each segment extends beyond an outer edge of each neighboring segment. As a result, corners of the first adhesive 106 may be strengthened and the first adhesive 106 may be prevented from breaking by the high pressure created during the reflowing process as discussed above. The second adhesive 108 may have two discrete parts, which are separated by two openings. For example, each part of the second adhesive 108 may have a shape of a bracket. As a result, pressure build-up may be prevented or reduced in the space between the outer sidewall of the first adhesive 106 and an inner sidewall of the bottom portion 110B of the lid 110. The two parts of the second adhesive 108 may partially surround the first adhesive 106.

Figure 19A:
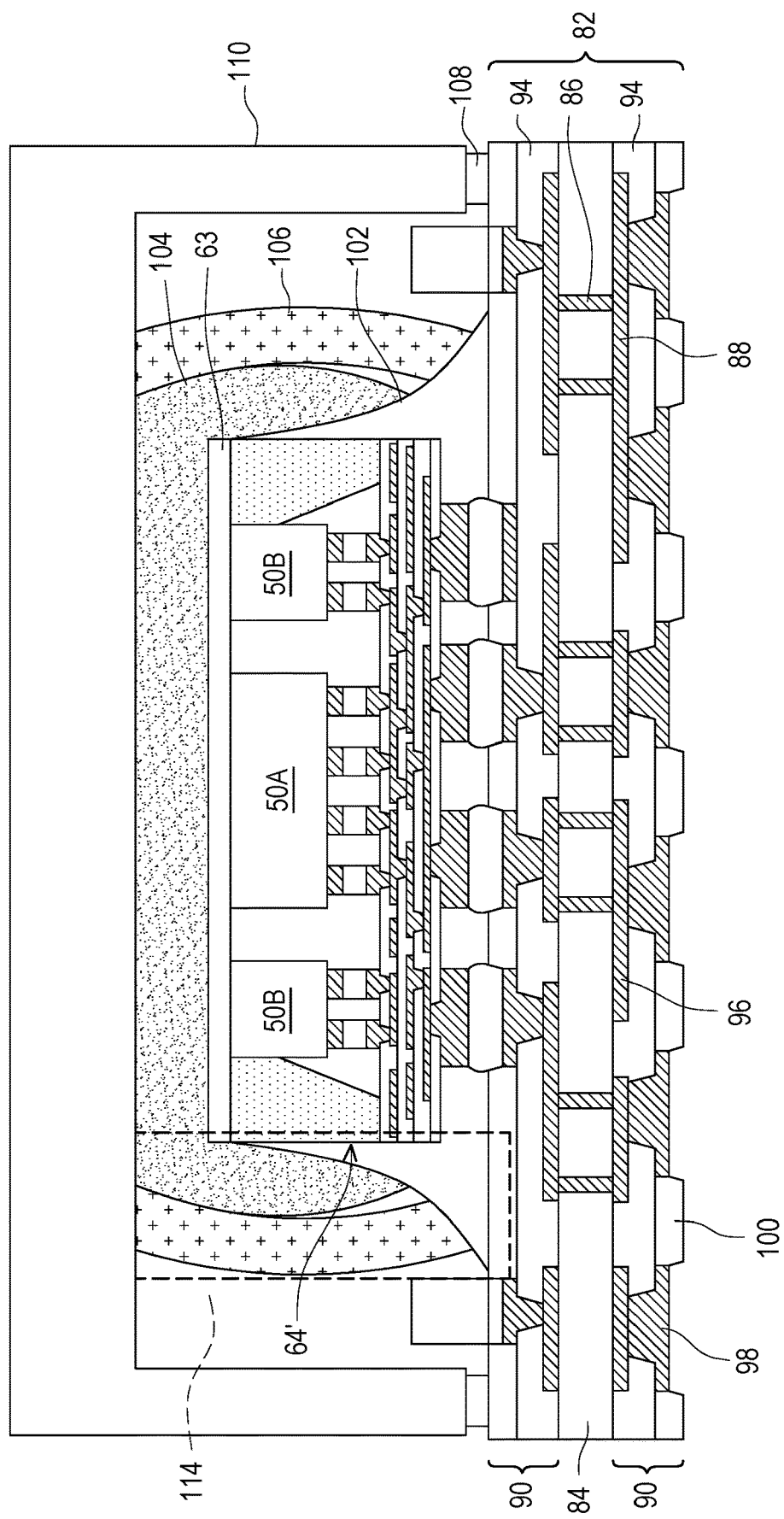

FIG. 19A shows a semiconductor package 122 similar to the semiconductor package 120 shown in FIG. 18A in accordance with some embodiments, wherein like reference numerals refer to like features. In FIG. 19A, the first adhesive 106 may be disposed completely on the underfill 102 such that no portion of the first adhesive 106 contacts an upper surface of the substrate 82. The materials, shapes, sizes of the first adhesive 106 and the second adhesive 108 in the semiconductor package 122 may be the same as or similar to those of the first adhesive 106 and the second adhesive 108 in the semiconductor package 120, respectively, as discussed above. The TIM 104 may extend on the underfill 102 and the inner sidewall of the first adhesive 106, and one or more air gaps may be disposed between the TIM 104 and the inner sidewall of the first adhesive 106. In some embodiments, the underfill 102 may be partially covered by the TIM 104 and the first adhesive 106, wherein portions of the underfill 102 are exposed. FIG. 19A illustrates sidewalls of the package structure 64' being completely covered by the underfill 102 as an example. In the embodiments where sidewalls of the package structure 64' are not completely covered by the underfill 102, the TIM 104 may extend on the sidewalls of the package structure 64', such as on sidewalls of the interposer 46 and/or sidewalls of the encapsulant 60.

Figure 19B:
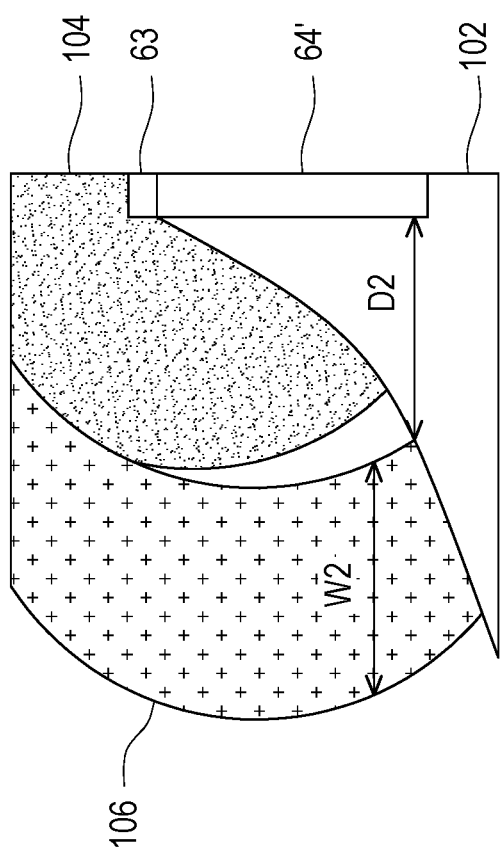

FIG. 19B shows a portion of the semiconductor package 122 referred to as the region 114 in FIG. 19A. The first adhesive 106 may have a width W2, which is a smallest horizontal distance between the inner sidewall and the outer sidewall of the first adhesive 106. The width W2 may be in a range from about 1 mm to about 3 mm. The first adhesive 106 may be spaced apart from the package structure 64' by a distance D2, which is a smallest horizontal distance between the inner sidewall of the first adhesive 106 and an outer sidewall of the package structure 64'. The distance D2 may be in a range from about 1 mm to about 3 mm. The benefits of the width W2 and the distance D2 in such ranges are similar to the benefits of the width W1 and the distance D1 in the corresponding ranges, respectively, as discussed above with respect to FIG. 18C.

Figure 20A:
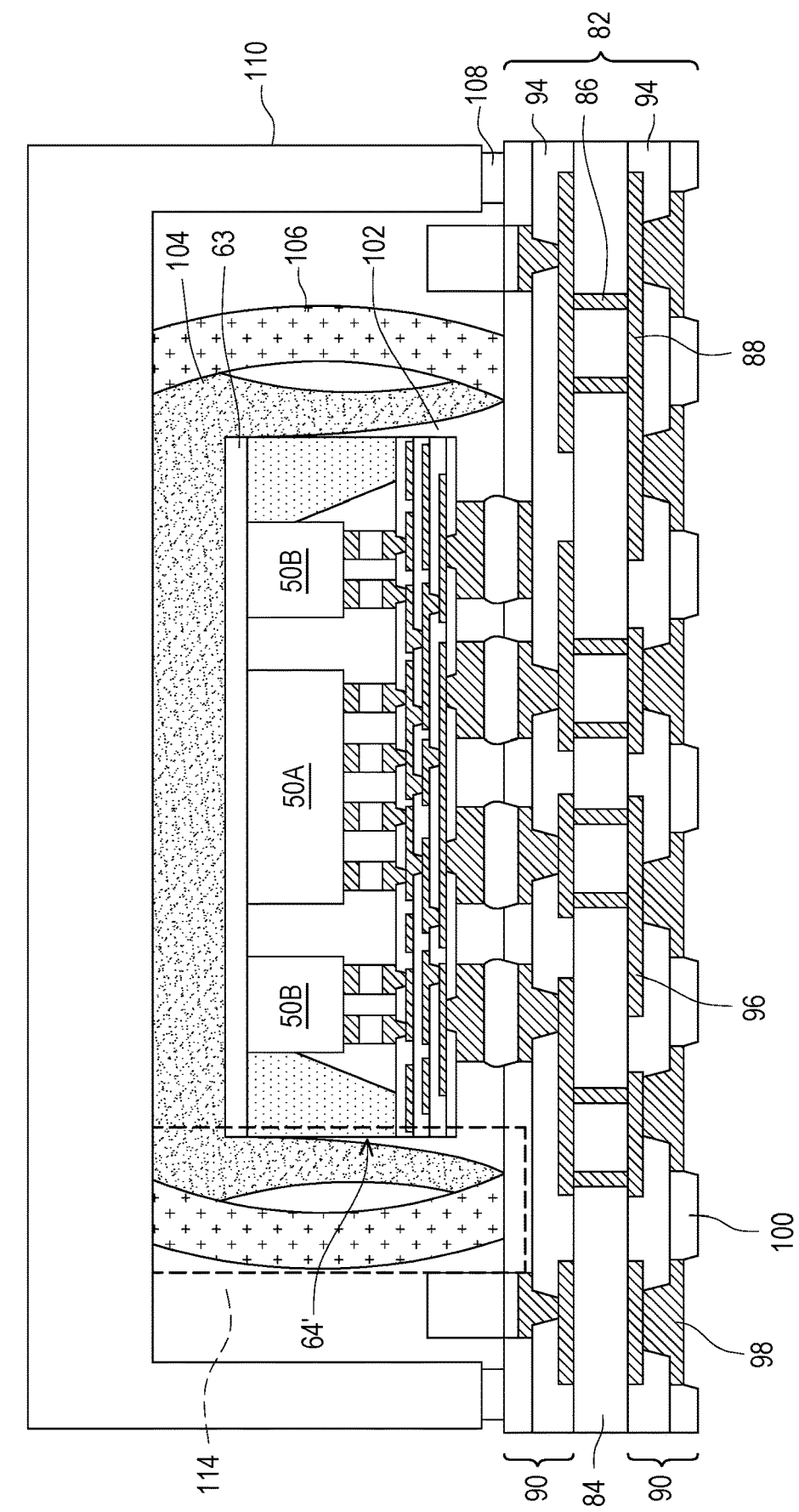

FIG. 20A shows a semiconductor package 124 similar to the semiconductor package 120 shown in FIG. 18A in accordance with some embodiments, wherein like reference numerals refer to like features. In FIG. 20A, the first adhesive 106 may be disposed completely on an upper surface of the substrate 82 such that no portion of the first adhesive 106 contacts the underfill 102. The materials, shapes, sizes of the first adhesive 106 and the second adhesive 108 in the semiconductor package 124 may be the same as or similar to those of the first adhesive 106 and the second adhesive 108 in the semiconductor package 120, respectively, as discussed above. The TIM 104 may extend on the underfill 102 and the inner sidewall of the first adhesive 106, and one or more air gaps may be disposed between the TIM 104 and the inner sidewall of the first adhesive 106. In some embodiments, the underfill 102 may be completely covered by the TIM 104. FIG. 20A illustrates sidewalls of the package structure 64' being completely covered by the underfill 102 as an example. In the embodiments where sidewalls of the package structure 64' are not completely covered by the underfill 102, the TIM 104 may extend on the sidewalls of package structure 64', such as on the sidewalls of the interposer 46 and/or the sidewalls of the encapsulant 60.

Figure 20B:
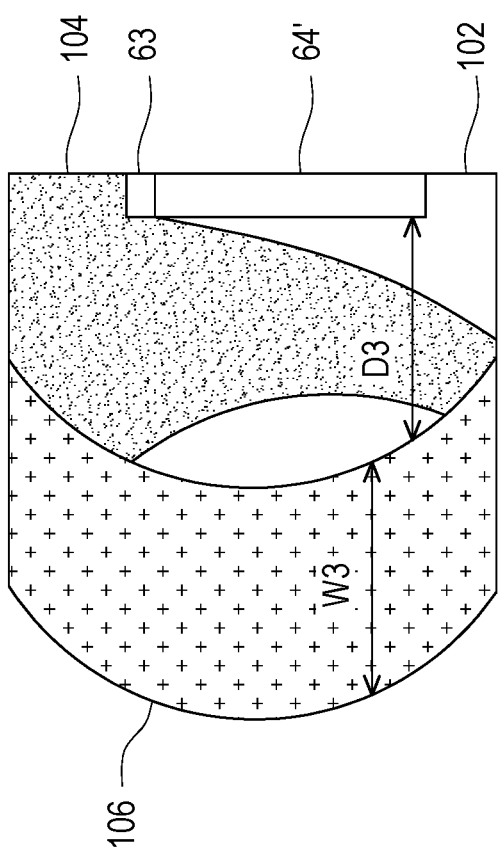

FIG. 20B shows a portion of the semiconductor package 124 referred to as the region 114 in FIG. 20A. The first adhesive 106 may have a width W3, which is a smallest horizontal distance between the inner sidewall and the outer sidewall of the first adhesive 106. The width W3 may be in a range from about 1 mm to about 3 mm. The first adhesive 106 may be spaced apart from the package structure 64' by a distance D3, which is a smallest horizontal distance between the inner sidewall of the first adhesive 106 and an outer sidewall of the package structure 64'. The distance D3 may be in a range from about 1 mm to about 3 mm. The benefits of the width W3 and the distance D3 in such ranges are similar to the benefits of the width W1 and the distance D1 in the corresponding ranges, respectively, as discussed above with respect to FIG. 18C.

The embodiments of the present disclosure have some advantageous features. By utilizing the first adhesive 106 of a high stiffness and the second adhesive 108 of a low stiffness between the lid 110 and the substrate 82, the heat transfer from the package components 50, through the metal layer 63 and the TIM 104, to the lid 110 is improved, and the cracking of the package structure 64' may be prevented or reduced. As a result the long-term reliability of the semiconductor packages 120, 122, and 124 may be improved.

In an embodiment, a semiconductor package includes a package component comprising a semiconductor die; a substrate bonded to a first side of the package component; a first adhesive over the substrate, wherein the first adhesive encircles the package component in a top view; a heat transfer layer on a second side the package component, wherein the first adhesive encircles the heat transfer layer in the top view; and a lid including: a top portion on the heat transfer layer and the first adhesive; and a bottom portion attached to the substrate by a second adhesive, wherein a material of the second adhesive is different from a material of the first adhesive, and wherein the bottom portion encircles the first adhesive in the top view. In an embodiment, a Young's modulus of the first adhesive is larger than a Young's modulus of the second adhesive. In an embodiment, a Young's modulus of the first adhesive is in a range from 10 MPa to 100 MPa. In an embodiment, a Young's modulus of the second adhesive is in a range from 1 MPa to 10 MPa. In an embodiment, the first adhesive includes four segments in the top view, wherein each segment of the four segments intersects with two neighboring segments of the four segments, and wherein each segment of the four segments extends beyond an outer edge of each neighboring segment of the four segments. In an embodiment, the second adhesive surrounds the first adhesive in the top view, and wherein the second adhesive includes two portions that are physically separated from each other by two openings. In an embodiment, the first adhesive is spaced apart from the package component by a distance larger than 1 mm.

In an embodiment, a semiconductor package includes an interposer; a package component bonded to a first side of the interposer, the package component including a semiconductor die; an encapsulant on the first side of the interposer, wherein the encapsulant encircles the package component in a top view; a substrate bonded to a second side of the interposer; an underfill between the interposer and the substrate; a first adhesive over the substrate, wherein the first adhesive encircles the interposer in the top view; a metal layer over the package component, wherein the metal layer extends on the underfill; and a lid structure, wherein a first bottom surface of the lid structure is bonded to the metal layer and attached to the first adhesive, wherein the metal layer is confined by the lid structure and the first adhesive, wherein a second bottom surface of the lid structure is attached to the substrate by a second adhesive, and wherein the first adhesive has a different stiffness from the second adhesive. In an embodiment, the first adhesive is partially disposed on the underfill and partially disposed on the substrate. In an embodiment, the first adhesive physically contacts the underfill. In an embodiment, the first adhesive physically contacts an upper surface of the substrate. In an embodiment, the first adhesive has a thickness larger than 1 mm. In an embodiment, an inner sidewall of the first adhesive is concave.

In an embodiment, method of manufacturing a semiconductor package includes bonding a package component to a substrate, the package component including: an interposer, wherein the substrate is bonded to a first side of the interposer; a semiconductor die bonded to a second side of the interposer; and an encapsulant on the second side of the interposer and encircling semiconductor die, wherein a first metal layer is disposed on the package component and in contact with the semiconductor die; forming an underfill between the package component and the substrate; placing a metallic material on the first metal layer; dispensing a first adhesive and a second adhesive over the substrate, wherein a material of the first adhesive is different from a material of the second adhesive, and wherein the first adhesive encloses the package component in a top view; and placing a lid structure over the substrate, wherein the first adhesive is in contact with a first bottom surface of the lid structure, and wherein the second adhesive is in contact with a second bottom surface of the lid structure and the substrate. In an embodiment, the material of the first adhesive includes less silicone than the material of the second adhesive. In an embodiment, the method further includes curing the first adhesive and the second adhesive, wherein curing the first adhesive and the second adhesive includes applying compressive pressure on top surfaces and bottom surfaces of the first adhesive and the second adhesive. In an embodiment, the method further includes reflowing the metallic material to form a second metal layer, wherein the second metal layer is bonded to the first metal layer and the lid structure. In an embodiment, forming the second metal layer includes forming the second metal layer in contact with the first adhesive and the underfill. In an embodiment, dispensing the first adhesive includes dispensing the first adhesive in contact with the underfill. In an embodiment, dispensing the first adhesive includes dispensing the first adhesive in contact with the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a package component comprising a semiconductor die;
   a substrate bonded to a first side of the package component;
   a first adhesive over the substrate, wherein the first adhesive encircles the package component in a top view, and wherein the first adhesive extends along a sidewall of the package component in a cross-sectional view;

a heat transfer layer on a second side of the package component, wherein the first adhesive encircles the heat transfer layer in the top view; and a lid comprising:
 a top portion on the heat transfer layer and the first adhesive; and
 a bottom portion attached to the substrate by a second adhesive, wherein a material of the second adhesive is different from a material of the first adhesive, and wherein the bottom portion encircles the first adhesive in the top view.

2. The semiconductor package of claim 1, wherein a Young's modulus of the first adhesive is larger than a Young's modulus of the second adhesive.

3. The semiconductor package of claim 1, wherein a Young's modulus of the first adhesive is in a range from 10 MPa to 100 MPa.

4. The semiconductor package of claim 1, wherein a Young's modulus of the second adhesive is in a range from 1 MPa to 10 MPa.

5. The semiconductor package of claim 1, wherein the first adhesive comprises four segments in the top view, wherein each segment of the four segments intersects with two neighboring segments of the four segments, and wherein each segment of the four segments extends beyond an outer edge of each neighboring segment of the four segments.

6. The semiconductor package of claim 1, wherein the second adhesive surrounds the first adhesive in the top view, and wherein the second adhesive comprises two portions that are physically separated from each other by two openings.

7. The semiconductor package of claim 1, wherein the first adhesive is spaced apart from the package component by a distance larger than 1 mm.

8. A semiconductor package comprising:
 an interposer;
 a package component bonded to a first side of the interposer, the package component comprising a semiconductor die;
 an encapsulant on the first side of the interposer, wherein the encapsulant encircles the package component in a top view;
 a substrate bonded to a second side of the interposer;
 an underfill between the interposer and the substrate;
 a first adhesive over the substrate, wherein the first adhesive encircles the interposer in the top view;
 a metal layer over the package component, wherein the metal layer extends on the underfill; and
 a lid structure, wherein a first bottom surface of the lid structure is bonded to the metal layer and attached to the first adhesive, wherein the metal layer is confined by the lid structure and the first adhesive, wherein a second bottom surface of the lid structure is attached to the substrate by a second adhesive, and wherein the first adhesive has a different stiffness from the second adhesive.

9. The semiconductor package of claim 8, wherein the first adhesive is partially disposed on the underfill and partially disposed on the substrate.

10. The semiconductor package of claim 8, wherein the first adhesive physically contacts the underfill.

11. The semiconductor package of claim 8, wherein the first adhesive physically contacts an upper surface of the substrate.

12. The semiconductor package of claim 8, wherein the first adhesive has a thickness larger than 1 mm.

13. The semiconductor package of claim 8, wherein an inner sidewall of the first adhesive is concave.

14. A method of manufacturing a semiconductor package, the method comprising:
 bonding a package component to a substrate, the package component comprising:
  an interposer, wherein the substrate is bonded to a first side of the interposer;
  a semiconductor die bonded to a second side of the interposer; and
  an encapsulant on the second side of the interposer and encircling the semiconductor die, wherein a first metal layer is disposed on the package component and in contact with the semiconductor die;
 forming an underfill between the package component and the substrate;
 placing a metallic material on the first metal layer;
 dispensing a first adhesive and a second adhesive over the substrate, wherein a material of the first adhesive is different from a material of the second adhesive, and wherein the first adhesive encloses the package component in a top view; and
 placing a lid structure over the substrate, wherein the first adhesive is in contact with a first bottom surface of the lid structure, and wherein the second adhesive is in contact with a second bottom surface of the lid structure and the substrate.

15. The method of claim 14, wherein the material of the first adhesive comprises less silicone than the material of the second adhesive.

16. The method of claim 14, further comprising curing the first adhesive and the second adhesive, wherein curing the first adhesive and the second adhesive comprises applying compressive pressure on top surfaces and bottom surfaces of the first adhesive and the second adhesive.

17. The method of claim 14, further comprising reflowing the metallic material to form a second metal layer, wherein the second metal layer is bonded to the first metal layer and the lid structure.

18. The method of claim 17, wherein forming the second metal layer comprises forming the second metal layer in contact with the first adhesive and the underfill.

19. The method of claim 14, wherein dispensing the first adhesive comprises dispensing the first adhesive in contact with the underfill.

20. The method of claim 14, wherein dispensing the first adhesive comprises dispensing the first adhesive in contact with the substrate.

* * * * *